United States Patent
Kubo et al.

(10) Patent No.: US 8,658,910 B2
(45) Date of Patent: Feb. 25, 2014

(54) CIRCUIT BOARD AND METHOD OF MANUFACTURING THE CIRCUIT BOARD

(75) Inventors: Tetsuro Kubo, Osaka (JP); Tsuyoshi Himori, Osaka (JP); Shogo Hirai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/704,248

(22) PCT Filed: Jun. 7, 2012

(86) PCT No.: PCT/JP2012/003726
§ 371 (c)(1),
(2), (4) Date: Dec. 14, 2012

(87) PCT Pub. No.: WO2012/172757
PCT Pub. Date: Dec. 20, 2012

(65) Prior Publication Data
US 2013/0153276 A1    Jun. 20, 2013

(30) Foreign Application Priority Data
Jun. 17, 2011   (CN) ............................. 2011-134882

(51) Int. Cl.
*H05K 1/11*  (2006.01)
*H05K 1/09*  (2006.01)

(52) U.S. Cl.
USPC .................................... 174/262; 174/257

(58) Field of Classification Search
USPC ............... 174/257, 262–266; 361/792–795
See application file for complete search history.

(56) References Cited

U.S. PATENT DOCUMENTS

| 7,410,673 B2 * | 8/2008 | Sato et al. ............... 427/386 |
| 7,488,785 B2 * | 2/2009 | Setiabudi ............... 525/532 |
| 2003/0085058 A1 | 5/2003 | Komatsu et al. |
| 2007/0107931 A1 | 5/2007 | Takenaka et al. |

FOREIGN PATENT DOCUMENTS

| CN | 1685775 | 10/2005 |
| JP | 2000-261116 | 9/2000 |
| JP | 2003-179356 | 6/2003 |
| JP | 2004-059896 | 2/2004 |
| JP | 3783682 | 6/2006 |
| JP | 2007-201492 | 8/2007 |
| JP | 4173241 | 10/2008 |

OTHER PUBLICATIONS

International Search Report issued Aug. 7, 2012 in International (PCT) Application No. PCT/JP2012/003726.
Written Opinion of the International Searching Authority issued Aug. 7, 2012 in International (PCT) Application No. PCT/JP2012/003726 (with English translation).

* cited by examiner

*Primary Examiner* — Jeremy Norris
(74) *Attorney, Agent, or Firm* — Wenderoth, Lind & Ponack, L.L.P.

(57) ABSTRACT

A circuit board includes a core substrate portion, an insulating layer, a second wiring, and a via to be a cured product of a via paste. The via paste has a first latent curing agent and a second latent curing agent, an uncured resin mixture, and a conductive particle. Both a softening temperature of the first latent curing agent and that of the second latent curing agent are equal to or higher than 40° C. and are equal to or lower than 200° C., and a difference between the softening temperature of the first latent curing agent and that of the second latent curing agent is equal to or higher than 10° C. and is equal to or lower than 140° C.

10 Claims, 24 Drawing Sheets

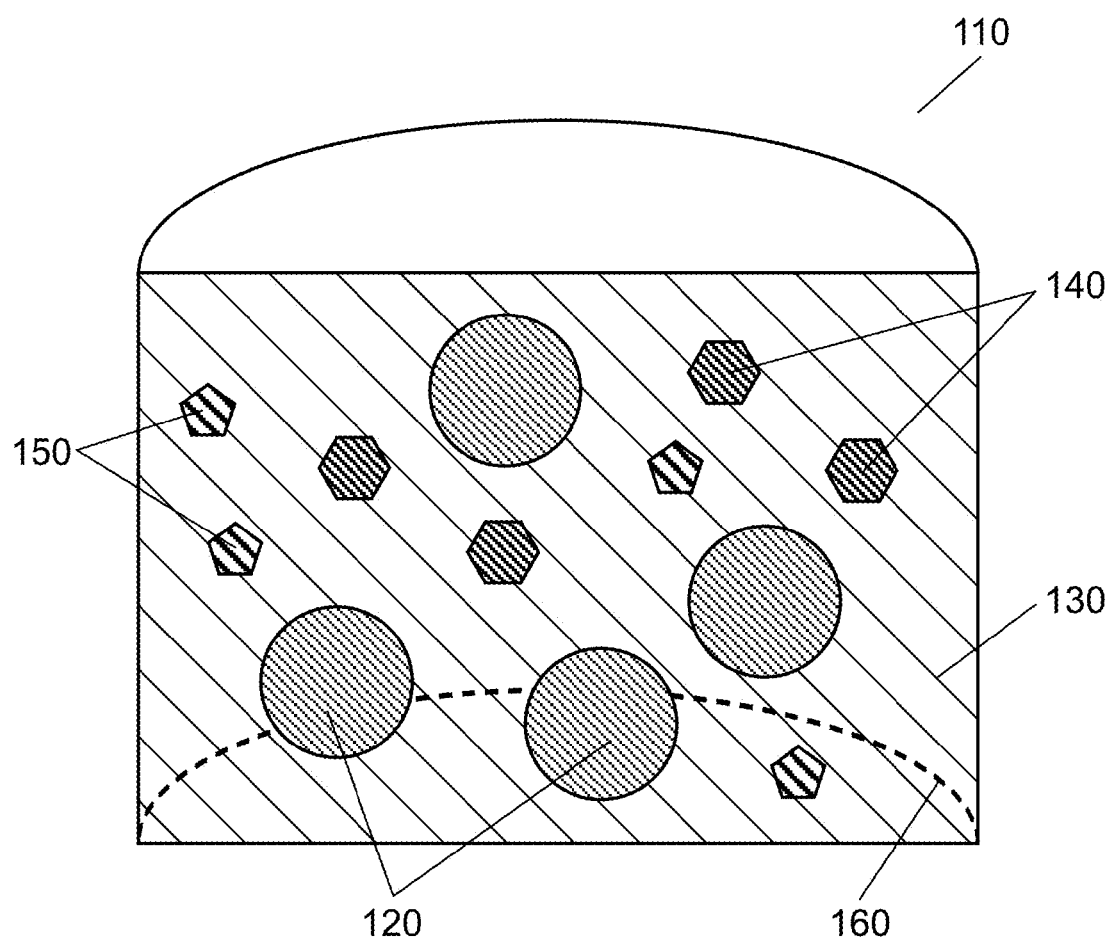

CIRCUIT BOARD AND METHOD OF MANUFACTURING THE CIRCUIT BOARD

This application is a U.S. national stage application of the PCT international application No. PCT/JP 2012/003726, filed Jun. 7, 2012.

TECHNICAL FIELD

The present invention relates to a circuit board having a via hole conductor for connecting two wirings formed on an insulating resin layer and a method of manufacturing the circuit board. In particular, the present invention relates to a circuit board having a via paste capable of carrying out an interlayer connection for a multilayer wiring in an optional position.

BACKGROUND ART

Conventionally, there is known a multilayer circuit board in which two wirings formed on an insulating resin layer are connected to each other. As an interlayer connecting method, it is known to provide a via hole conductor formed by filling a hole formed on an insulating resin layer with a conductive paste.

In the case in which the conductive paste is used as the via hole conductor, the conductive paste in an uncuring state in the via hole conductor is cured together with a prepreg in semi-curing state. For this reason, the curing of the conductive paste is influenced by a resin contained in the prepreg (softening, flow or the like) in some cases.

FIGS. 22A to 24C are typical sectional views showing a conventional method of manufacturing a circuit board. With reference to FIGS. 22A to 24C, description will be given to the conventional method of manufacturing a circuit board.

As shown in FIG. 22A, first of all, protective film 1 is formed on both surfaces of prepreg 2.

As shown in FIG. 22B, next, hole 3 is formed on prepreg 2 and protective film 1.

As shown in FIG. 22C, subsequently, squeegee 5 is moved in a direction of arrow 6 over protective film 1, and hole 3 formed on prepreg 2 is filled with via paste 4.

As shown in FIG. 23A, then, protective film 1 is peeled so that copper foil 8 is provided on the both surfaces of prepreg 2 having a part of via paste 4 set to be protruded portion 7 and they are pressurized, heated, and integrated as shown in arrow 6.

As shown in FIG. 23B, thereafter, via 11 and insulating layer 10 are formed by curing via paste 4 and prepreg 2, respectively.

As shown in FIG. 23C, next, copper foil 8 fixed to a surface of insulating layer 10 is subjected to etching to form wiring 12. Clearance 14 is present between a plurality of wirings 12 provided on a surface of core substrate portion 13.

As shown in FIG. 24A, subsequently, prepreg 2 provided with protruded portion 7 constituted by via paste 4 and copper foil 8 are laminated on wiring 12 provided on the surface of core substrate portion 13.

As shown in FIG. 24B, then, a part of prepreg 2 flows as shown in arrow 6b to fill in clearance 14 between wirings 12. With reference to FIG. 24C, further detailed description will be given to a portion shown in additional line 15 of FIG. 24B.

FIG. 24C shows a state in which a part of via paste 4 flows so that deformed via 16 is formed when a part of prepreg 2 heated and softened flows as shown in arrow 6b to fill in clearance 14 between wirings 12.

In order for prepreg 2 softened by the heating to cause via paste 4 to flow, clearance 14 between wirings 12 is narrowed by a via (deformed via 16) flowing in from both sides as shown in arrow 6b. For example, an interval shown in arrow 6d is narrowed as shown in arrow 6c.

In order to meet a demand for thinning a circuit board, it is desirable that prepreg 2 should be thinned. When prepreg 2 is thinned more greatly, however, it is harder to cause a portion between wirings 12 to be flat. For this reason, a further fluidization of prepreg 2 is required. When the circuit board is thinned more greatly, and furthermore, a pattern is made finer or an adjacency is enhanced more greatly, via paste 4 is more deformed. As a result, an occurrence probability of deformed via 16 is increased.

When the circuit board thus has a finer pith (including a decrease in a via diameter, a reduction in an adjacency between the vias and the like), there is increased a possibility that the deformation of the via caused by the via paste might influence an insulating property between the wirings, a migration characteristic, a via resistance and a variation in the via resistance.

Against the problems, it is proposed to drop a curing start temperature of a conductive paste to be lower than a melting start temperature of an insulating sheet. As the citation list, for example, PTL 1 is known.

CITATION LIST

Patent Literature

PTL 1: Unexamined Japanese Patent Publication No. 2003-179356

SUMMARY OF THE INVENTION

A circuit board according to the present embodiment includes a core substrate portion having a first wiring provided on a surface, a second wiring laminated on the core substrate portion through an insulating layer, and a via filled to have a protruded portion in a hole formed on the insulating layer and electrically connecting the first wiring to the second wiring. The insulating layer is formed of a cured product of a prepreg and the via is formed of a cured product of a via paste. The via paste has a first latent curing agent and a second latent curing agent, an uncured resin mixture to be cured by the first latent curing agent and the second latent curing agent, and a conductive particle. Both a softening temperature of the first latent curing agent and that of the second latent curing agent are equal to or higher than 40° C. and are equal to or lower than 200° C., and a difference between the softening temperature of the first latent curing agent and that of the second latent curing agent is equal to or higher than 10° C. and is equal to or lower than 140° C. The prepreg is softened between the softening temperature of the first latent curing agent and that of the second latent curing agent. The via paste is cured by increase in a viscosity and is thus changed into the cured product of the via paste in the hole of the prepreg.

Moreover, the present embodiment provides a method of manufacturing a circuit board including a core substrate portion having a first wiring provided on a surface, a second wiring laminated on the core substrate portion through an insulating layer formed of a cured product of a prepreg, and a via formed of a cured product of a via paste filled to have a protruded portion in a hole formed on the prepreg to be the insulating layer and electrically connecting the first wiring to the second wiring. The via paste has a first latent curing agent and a second latent curing agent, an uncured resin mixture to be cured by the first latent curing agent and the second latent curing agent, and a conductive particle. Both a softening temperature of the first latent curing agent and that of the second latent curing agent are equal to or higher than 40° C. and are equal to or lower than 200° C., and a difference between the softening temperature of the first latent curing agent and that of the second latent curing agent is equal to or higher than 10° C. and is equal to or lower than 140° C. The prepreg is softened between the softening temperature of the first latent curing agent and that of the second latent curing agent. The via paste is cured by increase in a viscosity and is thus changed into the cured product of the via paste in the hole of the prepreg. The method of manufacturing a circuit board includes a preparing step of preparing the prepreg, a first step of covering a surface of the prepreg with a protective film, and a second step of forming the hole on the prepreg through the protective film. Furthermore, the method includes a third step of filling the hole with the via paste including the first latent curing agent and the second latent curing agent which have different curing start temperatures from each other, the uncured resin mixture to be cured by the first latent curing agent and the second latent curing agent, and the conductive particle, and a fourth step of peeling the protective film, thereby exposing the protruded portion formed through protrusion of a part of the via paste from the through hole after the third step. The method further includes a fifth step of disposing a copper foil all over the prepreg in order to cover the protruded portion, and a sixth step of press bonding the copper foil to a surface of the prepreg to compress the via paste via the protruded portion, thereby providing a face contact portion formed in face contact of the conductive particles with each other. The method includes, at a heating step subsequent to the sixth step, a first heating step of heating the via paste up to 40° C. or more and 200° C. or less, thereby starting a thermal curing reaction of the uncured resin mixture and the first latent curing agent, a second heating step of carrying out heating up to a higher temperature than that in the first heating step and 200° C. or less, thereby softening a prepreg resin in the prepreg, and a third heating step of carrying out heating up to a higher temperature than that in the second heating step and 200° C. or less, thereby starting a thermal curing reaction of the residual uncured resin mixture and the second latent curing agent. The core substrate portion is formed through the first to fourth steps, the second wiring is formed through the fifth step, and the via is formed through the sixth step and the subsequent heating step.

BRIEF DESCRIPTION OF DRAWINGS

FIG. 1 is a typical sectional view for explaining a via paste according to an embodiment of the present invention.

DESCRIPTION OF EMBODIMENTS

Figure 2A:
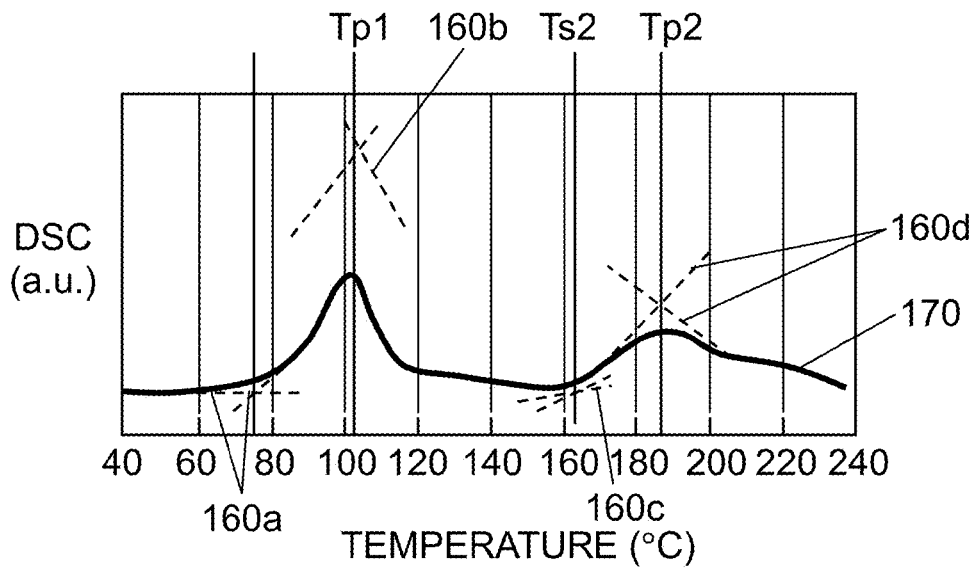
FIG. 2A is a graph showing a result of a measurement for a differential scanning calorimetry (DSC) of the via paste according to the embodiment of the present invention.

The via hole conductor in the multilayer circuit board disclosed in PTL 1 is a conductive paste containing a thermosetting resin, and a curing start temperature of the conductive paste is lower than a melting start temperature of an insulating sheet. In PTL 1, the conductive paste has already been started to be cured before the insulating sheet is molten. For this reason, the problem caused by the melting of the prepreg or the insulating sheet is relieved.

In PTL 1, however, there is used the conductive paste which is started to be cured at a lower temperature than the melting start temperature of the insulating sheet. Consequently, the curing of the via hole conductor has already been started or completed before the insulating sheet is molten and can thus flow. For this reason, there is a possibility that a cured resin component in the conductive paste might influence an electrical connection of conductor powder contained in the conductive paste. In the case in which a via diameter is small, particularly, there is a possibility that a via resistance might be increased, and furthermore, the via resistance might have a variation. By the present embodiment, the problems can be solved.

FIG. 1 is a typical sectional view for explaining a via paste according to an embodiment of the present invention. FIG. 1 is a typical sectional view in which a cylindrical via paste is cut. Via paste 110 has conductive particle 120, uncured resin mixture 130, first latent curing agent 140, and second latent curing agent 150. It is useful that an additive agent for enhancing print quality of via paste 110, for example, a solvent or a dispersing agent is added to via paste 110 in addition to conductive particle 120, uncured resin mixture 130, first latent curing agent 140, and second latent curing agent 150.

It is preferable that both first latent curing agent 140 and second latent curing agent 150 should be solid (or a solid body). By setting first latent curing agent 140 and second latent curing agent 150 to be solid (or the solid body) at a room temperature (20° C.), it is possible to substantially develop a curing reaction through liquefaction (or softening).

It is also useful that at least one of first latent curing agent 140 and second latent curing agent 150 is liquefied at the room temperature (20° C.). Thus, a reactivity to uncured resin mixture 130 is enhanced. Moreover, it is preferable that a curing developing mechanism in this case should be optimized individually depending on characteristics of first latent curing agent 140 and second latent curing agent 150 which are liquefied and are to be used.

It is useful to utilize a latent curing agent in a solid state as both first latent curing agent 140 and second latent curing agent 150. By setting them into the solid state, a thermal curing reaction to uncured resin mixture 130 is started at temperatures at which first latent curing agent 140 and second latent curing agent 150 are molten (or temperatures at which they are liquefied, temperatures at which they are softened or the like). Moreover, it is useful to add, to via paste 110, both latent curing agents (for example, first latent curing agents 140 and second latent curing agents 150) having different melting temperatures from each other (temperatures at which they are changed from the solid state to a liquid state, temperatures at which they are liquefied, or temperatures at which they are softened or a reaction is started) in the solid state. Consequently, a curing reaction to uncured resin mixture 130 can be started in a multistage (or at different temperatures from each other by 5° C. or more) at different melting temperatures (temperatures at which the change from the solid state to the liquid state is carried out or the like).

As a result, prepreg 230 (see FIGS. 7A and 7B) is softened at a plurality of temperatures (or steps) for the thermal curing reaction, and prepreg 230 flows while preventing via paste 110 from being deformed. For this reason, also in the case in which a via diameter is decreased or an adjacency is enhanced, it is possible to prevent an increase in a via resistance or an increase in a variation in the via resistance.

Uncured resin mixture 130 represents a mixture of uncured thermosetting resins which are different from each other. The different thermosetting resins are thermosetting resins in an uncuring state and uncured resin mixture 130 is a mixture of resins having different epoxy equivalent weights from each other. For example, uncured resin mixture 130 is a mixture of an uncured epoxy resin having an epoxy equivalent weight of approximately 450 (the number of functional groups is two) and an uncured epoxy resin having an epoxy equivalent weight of approximately 90 (the number of functional groups is three). By paying attention to the epoxy equivalent weight of the uncured thermosetting resin to be thus used and mixing plural kinds of resins having different epoxy equivalent weights (desirably 10 or more, and furthermore, 20 or 40 or more), it is possible to control reactivities to first latent curing agent 140 and second latent curing agent 150 each other. The latent curing agent is different from a so-called reactive diluent. Moreover, the number of functional groups represents the number of functional groups for a single molecular chain.

An uncured thermosetting resin having a large epoxy equivalent weight (for example, an epoxy equivalent weight of approximately 450) carries out a curing reaction later than an uncured thermosetting resin having a small epoxy equivalent weight (for example, an epoxy equivalent weight of approximately 90). Depending on the epoxy equivalent weight of the uncured thermosetting resin (the reaction is later with a larger epoxy equivalent weight and is quicker with a smaller epoxy equivalent weight), a plurality of reacting steps are provided as shown in FIGS. 2A, 3C, 4C and the like which will be described below.

A latent curing agent (latent hardener) serves to develop a reactivity to a thermosetting resin in an uncuring state through a change from a solid state to a liquid state (melting or softening), for example. Depending on purposes, it is also useful to utilize a liquid latent curing agent at a room temperature (20° C.).

Figure 2B:
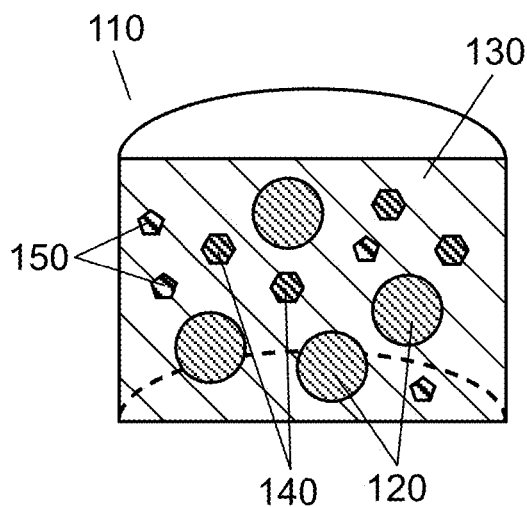
FIG. 2B is a typical sectional view showing a state in which the via paste is cured according to the embodiment of the present invention.
Figure 2C:
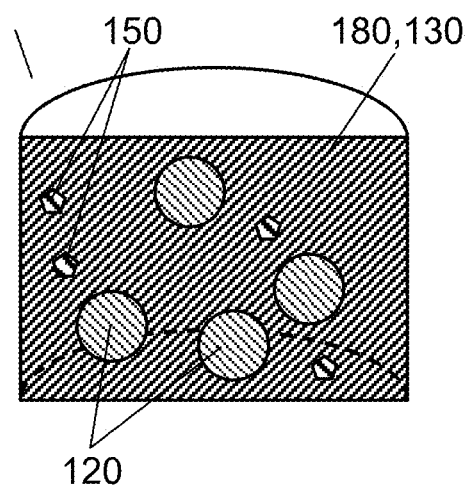
FIG. 2C is a typical sectional view showing the state in which the via paste is cured according to the embodiment of the present invention.
Figure 2D:
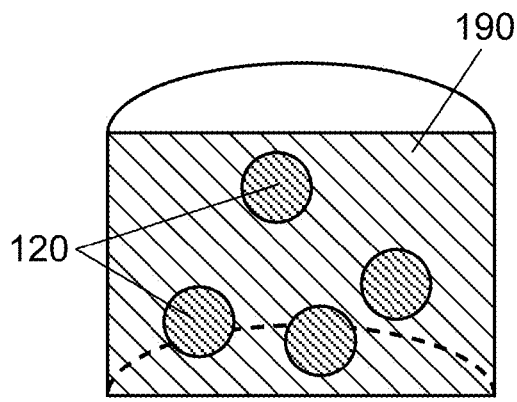
FIG. 2D is a typical sectional view showing the state in which the via paste is cured according to the embodiment of the present invention.

With reference to FIG. 2A, next, further detailed description will be given. FIG. 2A is a graph showing a result of a measurement for a differential scanning calorimetry (DSC) of via paste 110 according to the embodiment of the present invention. FIGS. 2B to 2D are typical sectional views showing a state in which via paste 110 is cured according to the embodiment of the present invention.

In FIG. 2A, an X axis (an axis of abscissas) indicates a temperature, showing a range of 40° C. to 240° C. A unit of the X axis is ° C. A Y axis (an axis of ordinates) indicates a value of a differential scanning calorimetry (DSC). A unit of the Y axis is an arbitrary unit (a. u.). A differential scanning calorimetry device serves to measure a difference in a heat quantity between a measurement sample (for example, via paste 110) and a standard substance, and a measuring device put on the market can be used. It is desirable that a temperature rising speed of the DSC should be equal to or higher than 1° C./minute and be equal to or lower than 10° C./minute in adaptation to a raised temperature (1° C./minute or more and 10° C./minute or less) in a process for manufacturing a circuit board.

The measurement does not need to be restricted to only the DSC but TG/DTA (Thermo Gravimetry/Differential Thermal Analyser) may be used. The TG/DTA can also measure a thermal curing behavior of via paste 110 (particularly, a curing start temperature, a curing heat generation peak temperature, a curing end temperature or the like) in the same manner as the DSC. It is also useful to utilize TMA (Thermo Mechanical Analyzer) if necessary. For the DSC or the like, it is preferable to refer to JIS standards, that is, JIS K7121, a method of measuring a transition temperature of plastic, JIS K7122, a method of measuring a transition heat of plastic, JIS K7123, a method of measuring a specific heat capacity of plastic or the like.

In the case in which both first latent curing agent 140 and second latent curing agent 150 are solid at the room temperature (20° C.), these softening temperatures can be measured by the TMA. For a method of measuring a softening temperature using the TMA, it is preferable to refer to JIS K7196, a softening temperature testing method through a thermomechanical analysis of a thermoplastic film and sheet, or the like.

Moreover, melting points of first latent curing agent 140 and second latent curing agent 150 may be set to be softening temperatures thereof.

In the case in which there are used first latent curing agent 140 and second latent curing agent 150 that are liquid (for example, liquid at the room temperature of 20° C.), it is preferable to set a temperature for developing a reactivity in place of the softening temperature. The reason is that a liquid (at least, liquid at the room temperature) latent curing agent has a reactivity developed by heat applied from an outside or the like and does not have a softening temperature which can be measured by the TMA.

In FIG. 2A, Tp1 and Tp2 denote a heat generation peak temperature in the DSC measurement of via paste 110. Tp1 denotes a peak temperature (a first heat generation peak temperature) of the heat generation caused by a reaction of a part of uncured resin mixture 130 and first latent curing agent 140. Tp1 is obtained by additional line 160b. Tp2 denotes a peak temperature (a second heat generation peak temperature) of the heat generation caused by a reaction of residual uncured resin mixture 130 and second latent curing agent 150. Tp2 is obtained by additional line 160d.

In FIG. 2A, Ts1 and Ts2 denote a reaction starting temperature in the DSC measurement of via paste 110. Ts1 denotes a reaction starting temperature (a first reaction starting temperature) of a thermal curing reaction of a part of uncured resin mixture 130 and first latent curing agent 140, and Ts1 is obtained by additional line 160a. Ts2 denotes a reaction starting temperature (a second reaction starting temperature) of a reaction of residual uncured resin mixture 130 and second latent curing agent 150. Ts2 is obtained by additional line 160c.

By using both first latent curing agent 140 and second latent curing agent 150 which are set in a solid state, it is possible to control Ts1, Ts2, Tp1, Tp2 or the like to be different from each other by 5° C. or more (furthermore, 10° C. or more) by utilizing melting temperatures (furthermore, reaction starting temperatures and the like).

In FIG. 2A, a part of additional lines 160a to 160d are intentionally shown apart from graph 170 in order to prevent FIG. 2A from being complicated.

A way for obtaining Ts1, Tp1, Ts2, Tp2 and the like or a way for drawing additional lines 160a to 160d to be used for obtaining them is based on the description of JIS or is usefully carried out by utilizing an automatic computing program offered from a measuring device manufacturer.

Second heat generation peak Tp2 corresponds to a reaction heat generated by a reaction of uncured resin mixture 130 which does not completely react to first latent curing agent 140 but is left and second latent curing agent 150 in via paste 110.

It is important to balance first latent curing agent 140 and second latent curing agent 150 with uncured resin mixture 130 which is started to be cured at a separate temperature.

For example, by increasing a rate of uncured resin mixture 130 to be equal to or higher than a necessary quantity for the reaction to first latent curing agent 140, it is possible to exactly leave uncured resin mixture 130 which does not completely react to first latent curing agent 140. Residual uncured resin mixture 130 and second latent curing agent 150 can be caused to newly react to each other at a higher temperature side. In the case in which an epoxy resin is used for uncured resin mixture 130, particularly, it is useful to calculate an epoxy equivalent weight thereof. The epoxy equivalent weight (a unit of g/eq) can be defined in a molecular weight of an epoxy resin per epoxy group.

Moreover, it is preferable that the equivalent weights of first latent curing agent 140 and second latent curing agent 150 should be calculated from an active hydrogen equivalent weight, an active amine equivalent weight or the like. It is desirable that the active hydrogen equivalent weight or the amine equivalent weight on the curing agent side should be almost equal to the epoxy equivalent weight on the epoxy resin side. In the case in which a variation in a manufacture of a product or the like is taken into consideration, however, it is useful to set the active hydrogen equivalent weight or the active amine equivalent weight to be slightly larger than the epoxy equivalent weight (by 1 wt % or less or 5 wt % or less, for example).

As described above, via paste 110 according to the present embodiment includes first latent curing agent 140 and second latent curing agent 150 which have different reaction starting temperatures from each other by at least 5° C. or more (furthermore, 10° C. or more) as shown in FIG. 2A. Alternatively, via paste 110 has at least two reaction starting temperatures which are different from each other by 5° C. or more (furthermore, 10° C. or more) and are indicated as Ts1 and Ts2. Alternatively, via paste 110 has a temperature indicative of at least two reaction peaks which are different from each other by 5° C. or more (furthermore, 10° C. or more) and are represented by Tp1 and Tp2. In the case in which these have a difference which is less than 5° C., there is a possibility that clearance 320 might be insufficiently filled by prepreg 230 as will be described later with reference to FIGS. 12 to 14.

FIGS. 2B to 2D are typical sectional views showing a state in which heating is carried out before or after the room temperature (for example, 20° C.) of via paste 110 so that the curing reaction of via paste 110 is advanced as a plurality of steps.

FIG. 2B is a typical view showing a section of via paste 110 in the vicinity of the room temperature (20° C.). As shown in FIG. 2B, via paste 110 includes at least conductive particle 120, uncured resin mixture 130, first latent curing agent 140 in a solid state, and second latent curing agent 150 in the solid state in the vicinity of the room temperature (furthermore, less than a temperature represented by Ts1 from the vicinity of 20° C.). Then, via paste 110 is heated to the room temperature or more (more specifically, up to a temperature exceeding temperature Ts1) so that a thermal curing reaction of first latent curing agent 140 and uncured resin mixture 130 is started. It is desirable to select, as first latent curing agent 140, a material which is solid at a room temperature and starts a thermal curing reaction to uncured resin mixture 130 by exceeding a melting point or liquefaction from the solid state. Then, via paste 110 indicates an initial peak of heat generation at temperature Tp1. A state brought after exceeding temperature Tp1 is shown in FIG. 2C. In FIG. 2C, first cured product 180 is formed by thermally curing a part of uncured resin mixture 130 and first latent curing agent 140 each other. In FIG. 2C, it is desirable that first cured product 180 and uncured resin mixture 130 should be brought into a mixing (compatible or coexistent) state with each other. Thus, uncured resin mixture 130 contained in first cured product 180 develops a stress relieving effect. As shown in FIG. 2C, it is useful to add a larger quantity of uncured resin mixture 130 so as not to be completely cured with first latent curing agent 140 (or so as not to be completely consumed) in order to mix first cured product 180 and uncured resin mixture 130.

Then, the heating is further carried out continuously. Consequently, the curing reaction of uncured resin mixture 130 which does not completely react but remains and second latent curing agent 150 is started at the temperature indicated as Ts2 in FIG. 2A. Thereafter, a state of FIG. 2D is brought through the peak (Tp2) of the reaction temperature shown in FIG. 2A.

FIG. 2D shows the curing state of via paste 110 at a high temperature side exceeding Tp2. In FIG. 2D, via paste 110 contains cured thermosetting resin 190 and conductive particle 120. Cured thermosetting resin 190 is constituted by first cured product 180 and a thermal cured product (not shown) obtained by a reaction of uncured resin mixture 130 which does not completely react but is coexistent with first cured product 180 and second latent curing agent 150. In FIGS. 2B to 2D, in the case in which via paste 110 is cured in the via hole, conductive particles 120 are press bonded to each other to form a face contact portion through mutual deformation as will be described later with reference to FIG. 10 or the like. However, such a portion is not shown.

Figure 3A:
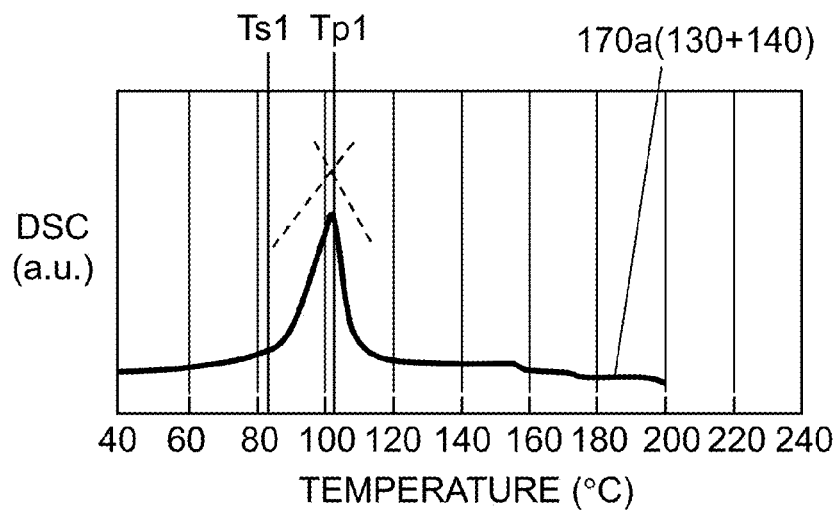
FIG. 3A is a graph showing a result of a measurement for DSC of a first latent curing agent and an uncured resin mixture according to the embodiment of the present invention.
Figure 3B:
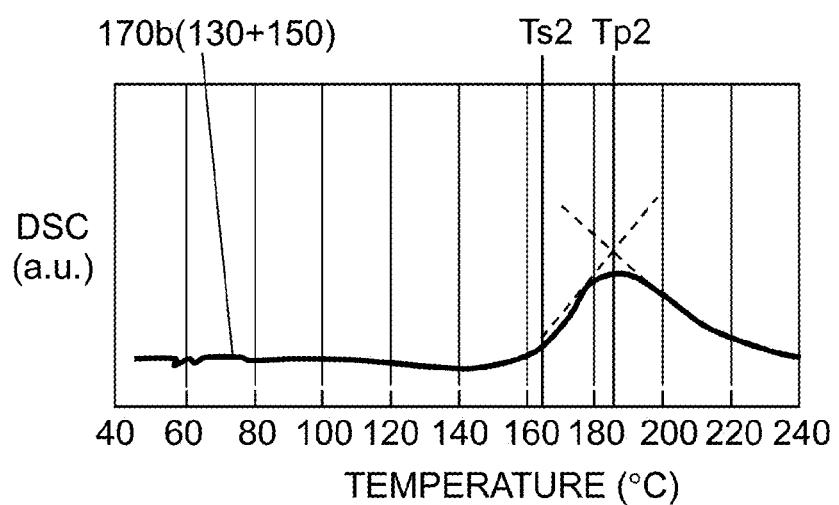
FIG. 3B is a graph showing a result of a measurement for DSC of a second latent curing agent and the uncured resin mixture according to the embodiment of the present invention.
Figure 3C:
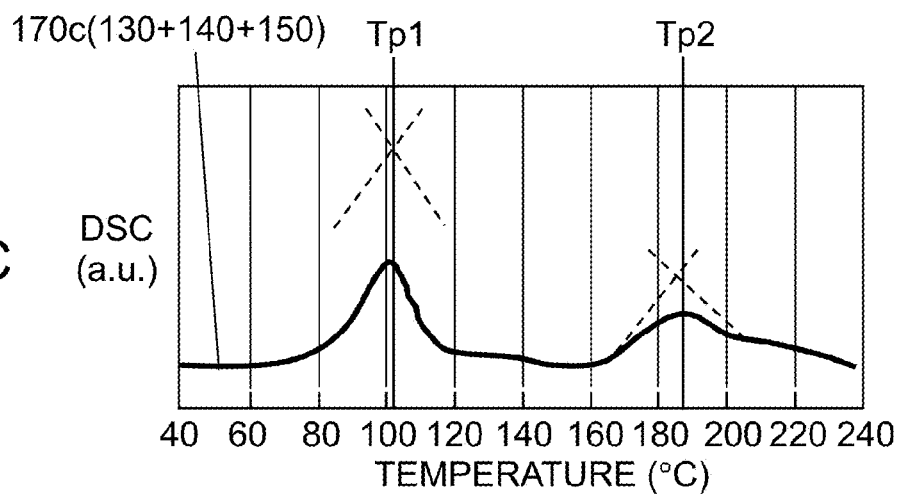
FIG. 3C is a graph showing a result of a measurement for DSC of the first latent curing agent, the second latent curing agent, and the uncured resin mixture according to the embodiment of the present invention.

Next, a result of a measurement for DSC of components of via paste 110 will be described with reference to FIGS. 3A to 3C. FIGS. 3A to 3C show graphs 170a to 170c indicative of an example of the result of the measurement for the DSC of the components of via paste 110.

FIG. 3A shows DSC data on a mixture containing uncured resin mixture 130 and first latent curing agent 140 which are members constituting via paste 110. By adding no conductive particle 120, it is also possible to more accurately measure a curing behavior with respect to temperatures of these members.

In FIG. 3A, Ts1 corresponds to a reaction starting temperature of uncured resin mixture 130 and first latent curing agent 140. Ts1 is obtained by using an additional line (not shown) as shown in FIG. 2A described above. Tp1 corresponds to a temperature indicative of a heat generation peak through the reaction of uncured resin mixture 130 and first latent curing agent 140.

FIG. 3B is a graph showing DSC of a mixture of uncured resin mixture 130 and second latent curing agent 150 which are members constituting via paste 110. By adding no conductive particle 120, it is also possible to more accurately measure a curing behavior with respect to temperatures of these members.

In FIG. 3B, Ts2 corresponds to a reaction starting temperature of uncured resin mixture 130 and second latent curing agent 150. Ts2 is obtained by using an additional line (not shown) as shown in FIG. 2A described above. Tp2 represents a heat generation peak temperature through the reaction of uncured resin mixture 130 and second latent curing agent 150.

FIG. 3C is a graph showing DSC of a mixture of uncured resin mixture 130, first latent curing agent 140 and second latent curing agent 150 which are the members constituting via paste 110. By adding no conductive particle 120, it is also possible to more accurately measure a curing behavior with respect to temperatures of these members.

In FIGS. 3A to 3C, Ts1 corresponds to a reaction starting temperature of uncured resin mixture 130 and first latent curing agent 140. Tp1 represents a heat generation peak temperature through the reaction of uncured resin mixture 130 and first latent curing agent 140. Ts2 corresponds to a reaction starting temperature of uncured resin mixture 130 which is not completely consumed by first latent curing agent 140 (or remains) and second latent curing agent 150. Tp2 represents a heat generation peak temperature through the reaction of uncured resin mixture 130 which is not completely consumed by first latent curing agent 140 and second latent curing agent 150.

As described above, it is useful to cause the reaction starting temperatures of first latent curing agent 140 and second latent curing agent 150, and uncured resin mixture 130 to be different from each other by at least 5° C. or more (furthermore, 10° C. or more).

In order to make such a selective difference in a reactivity, it is useful to utilize a design of a reaction mechanism or a low/high reaction speed. The design of the reaction mechanism indicates that plural kinds of solid latent curing agents having different melting temperatures are positively combined with each other by utilizing a property in which the solid latent curing agent is molten to start a reaction, for example.

It is useful that both of melting points of first latent curing agent 140 and second latent curing agent 150 contained in via paste 110 are equal to or higher than 40° C. and are equal to or lower than 200° C., and a difference between the melting points of first latent curing agent 140 and second latent curing agent 150 is equal to or higher than 10° C. (furthermore, is equal to or higher than 20° C., or moreover, is equal to or higher than 30° C.) and is equal to or lower than 140° C. (or is equal to or lower than 130° C., or is equal to or lower than 120° C.). As shown in the graph of FIG. 2A or 3C, consequently, via paste 110 has at least two heat generation peak temperatures (Tp1, Tp2), and furthermore, two or more reaction starting temperatures (Ts1, Ts2). Moreover, it is useful that at least two heat generation peak temperatures (Tp1, Tp2), and furthermore, two reaction starting temperatures (Ts1, Ts2) are equal to or higher than 40° C. and are equal to or lower than 200° C. together. In the case in which the heat generation peak temperatures (Tp1, Tp2), and furthermore, the reaction starting temperatures (Ts1, Ts2) are lower than 40° C. together, via paste 110 is naturally cured so that a pot life or the like is shortened. In the case in which the heat generation peak temperatures (Tp1, Tp2), and furthermore, the reaction starting temperatures (Ts1, Ts2) exceed 200° C. together, there is a possibility that prepreg 230 to be used as circuit board 330 which will be described later with reference to FIG. 7C might be special and expensive. In the case in which a difference between at least two heat generation peak temperatures (Tp1, Tp2) is less than 10° C., heat generation peak temperatures (Tp1, Tp2) overlap into one. Also in the case in which a via diameter is decreased, therefore, there is a possibility that a problem of an increase in a via resistance and an increase in a variation in the via resistance might be caused. In the case in which a difference between at least two heat generation peak temperatures is greater than 140° C., moreover, there is a possibility that a prepreg to be used as a multilayer circuit board might be special and expensive.

It is useful that via paste 110 has at least two reaction starting temperatures (Ts1, Ts2) in the differential scanning calorimetry, and the at least two reaction starting temperatures (Ts1, Ts2) are equal to or higher than 40° C. and a difference between the two reaction starting temperatures is equal to or higher than 10° C. and is equal to or lower than 140° C. In the case in which both of the reaction starting temperatures are lower than 40° C., there is a possibility that via paste 110 might be naturally cured to shorten the pot life or the like. In the case in which both of the reaction starting temperatures exceed 200° C., moreover, there is a possibility that the prepreg to be used as the multilayer circuit board might be special and expensive.

In the case in which a difference between the two reaction starting temperatures is less than 10° C., there is a possibility that a problem of an increase in a via resistance or an increase in a variation in the via resistance might be caused. In the case in which a difference between at least two reaction starting temperatures is greater than 140° C., moreover, there is a possibility that the prepreg might be special and expensive.

As described above, via paste 110 has at least first latent curing agent 140 and second latent curing agent 150 which are solid together, uncured resin mixture 130 to be cured by first latent curing agent 140 and second latent curing agent 150, and conductive particle 120. Both of melting points of first latent curing agent 140 and second latent curing agent 150 are equal to or higher than 40° C. and are equal to or lower than 200° C. and are different from each other within a range which is equal to or higher than 10° C. and is equal to or lower than 140° C., and via paste 110 has a temperature (Tp1, Tp2) indicative of at least two heat generation peaks. Moreover, via paste 110 has the temperature (Tp1, Tp2) indicative of these two heat generation peak temperatures. In a graph for a temperature and a viscosity of the via paste, consequently, it is possible to provide, in a temperature range of 70° C. to 160° C., a region in which a change in the viscosity is small (a kind of flat region) (see FIG. 4C). It is possible to generate a region in which a change in the temperature is small (that is, a region in which first cured product 180 to be a cured product of first latent curing agent 140 and uncured resin mixture 130 is coexistent with uncured resin mixture 130 which does not completely react). In the flat region, moreover, it is possible to prevent via paste 110 from being deformed by causing prepreg resin 370 contained in prepreg 230 to flow.

By curing via paste 110 in a multistage, thus, it is possible to optimize, into a circuit board, a behavior of the viscosity with respect to the temperature.

Next, there will be shown an example in which a characteristic of the viscosity with respect to the temperature in via paste 110 is optimized. Description will be given to an example of a result obtained by measuring the viscosity of via paste 110. As a viscometer, it is possible to use a rheometer put on the market such as RSA manufactured by UBM Corporation (for example, G1000), HAAKE Co., Ltd. (for example, RheoStress RS6000) or former Rheometric Scientific Co., Ltd. (current TA Instruments Inc.). A device used by the inventors is a rheometer of a cone plate type (the used cone has a diameter of 25 mm, a cone angle of two degrees, and a rotating speed of 0.5 rpm, and a shear rate or the like can be calculated based thereon). Referring to a measurement of a viscosity in the rheometer or the like, it is preferable to refer to JIS K7117-2, JIS K 6833 or the like. Although the viscosity may be set to be a steady flow viscosity (a viscosity obtained from a torque in a steady rotation), it is useful to set the viscosity to be a dynamic viscosity (a dynamic viscosity obtained from a stress generated in the case in which a sine vibration is applied).

Figure 4A:
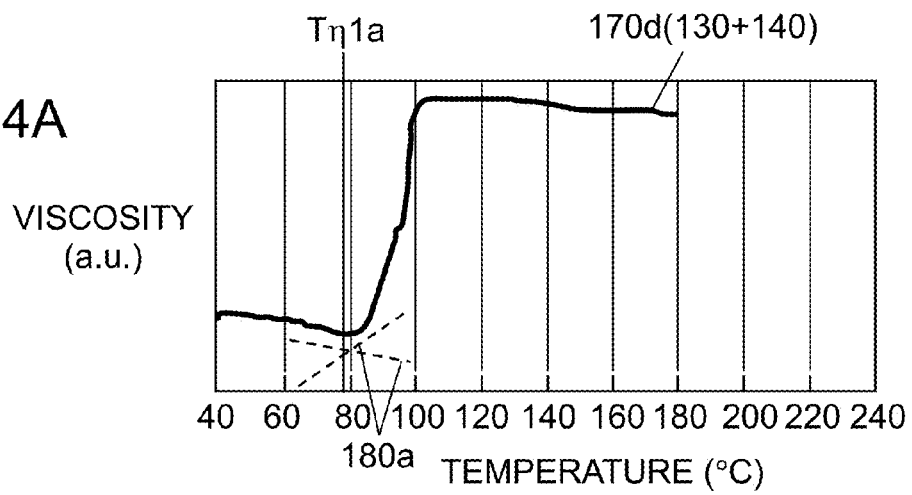
FIG. 4A is a graph showing a relationship between viscosities and temperatures of the first latent curing agent and the uncured resin mixture according to the embodiment of the present invention.
Figure 4B:
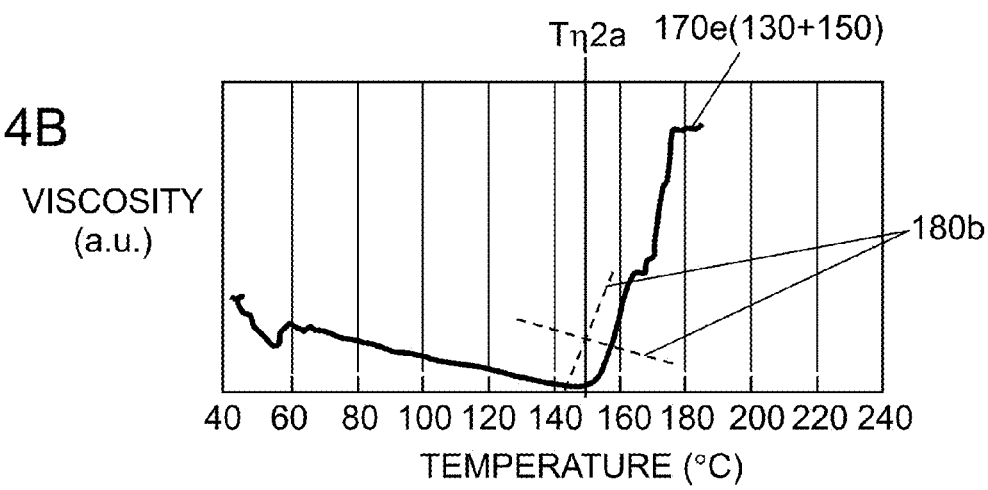
FIG. 4B is a graph showing a relationship between viscosities and temperatures of the second latent curing agent and the uncured resin mixture according to the embodiment of the present invention.
Figure 4C:
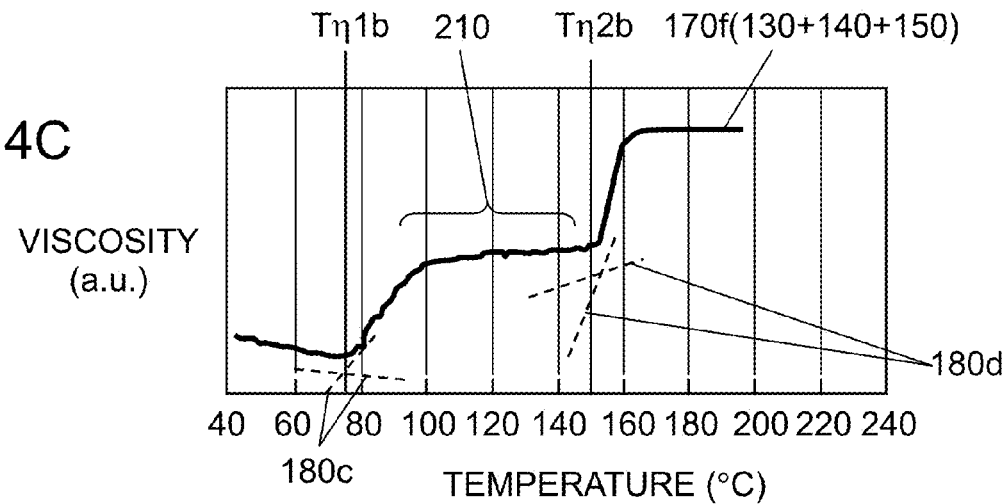
FIG. 4C is a graph showing a relationship between the viscosities and the temperatures of the first latent curing agent, the second latent curing agent, and the uncured resin mixture according to the embodiment of the present invention.

FIGS. 4A to 4C show graphs 170d to 170f indicative of an example of a result of a measurement for a correlation between a viscosity and a temperature of the member constituting via paste 110. An X axis (an axis of abscissas) indicates the temperature (a unit of ° C.) and a Y axis (an axis of ordinates) indicates the viscosity, and a unit of the Y axis is an arbitrary unit (a. u.). Since a change in the viscosity is great, moreover, the Y axis is shown in a logarithm.

FIG. 4A shows a result of a measurement for a relationship between a viscosity and a temperature in an equivalent sample to the sample illustrated in FIG. 3A. In other words, there is shown a result of a measurement for a viscosity of a mixture containing uncured resin mixture 130 and first latent curing agent 140 which are the members constituting via paste 110. By adding no conductive particle 120, it is also possible to more accurately measure a change in viscosities with respect to temperatures of these members.

In FIG. 4A, Tη1a represents a temperature indicative of the lowest viscosity of a measurement sample. In FIG. 4A, the sample is a liquid in the vicinity of 40° C. and has the lowest viscosity at Tη1a, and the viscosity is then raised up to the vicinity of 100° C. suddenly so that the sample is cured. Tη1a is obtained by using additional line 180a.

FIG. 4B shows a result of a measurement for a relationship between a viscosity and a temperature in an equivalent sample to the sample illustrated in FIG. 3B. In other words, there is shown a result of a measurement for a change in a viscosity of a mixture of uncured resin mixture 130 and second latent curing agent 150 which are the members constituting via paste 110. By adding no conductive particle 120, it is also possible to more accurately measure a curing behavior with respect to the temperatures of these members. In FIG. 4B, Tη2a represents a temperature indicative of the lowest viscosity of a measurement sample.

In FIG. 4B, the sample is a liquid in the vicinity of a room temperature and has the lowest viscosity at temperature Tη2a in the vicinity of 150° C. Then, the viscosity is raised suddenly with curing of the sample. Tη2a is obtained by using additional line 180b.

FIG. 4C shows a result of a measurement for the lowest viscosity of an equivalent sample to the sample illustrated in FIG. 3C. In other words, there is shown a result of a measurement for a change in a viscosity of a mixture of uncured resin mixture 130, first latent curing agent 140 and second latent curing agent 150 which are the members constituting via paste 110.

Tη1b shown in FIG. 4C is shifted to a higher temperature side than Tη1a indicative of the lowest viscosity in FIGS. 4A and Tη2b is shifted to a lower temperature side than Tη2a indicative of the lowest viscosity in FIG. 4B. By shifting Tη1a and Tη2a toward Tη1b and Tη2b at the higher and lower temperature sides respectively, it is possible to make a uniform mixing state of first cured product 180 in FIG. 2C and uncured resin mixture 130 mixed in first cured product 180. It is desirable that a shift temperature should be equal to or higher than 1° C. and be equal to or lower than 20° C. (and moreover, should be equal to or lower than 15° C., and furthermore, should be equal to or lower than 10° C.). In the case in which the shift temperature is lower than 1° C., there might be an influence on precision in a measurement or the like. In the case in which the shift temperature exceeds 20° C., moreover, there is a possibility that the mutual mixing state might be influenced. Tη1b is obtained by using additional line 180c. Tη2b is obtained by using additional line 180d.

In addition, it is desirable that a viscosity range of flat region 210 in FIG. 4C (that is, a value for the Y axis) should be equal to or greater than 100 Pa·s and be equal to or smaller than 10000 Pa·s (and furthermore, be equal to or greater than 300 Pa·s and be equal to or smaller than 3000 Pa·s). Within this range, there is desired a temperature at which a change in a viscosity with respect to a logarithmic axis (a Y axis) is small (that is, the change in the viscosity is limited into a range of ±two digits, and furthermore, a range of ±one digit or a range of ten times or less).

Figure 12:
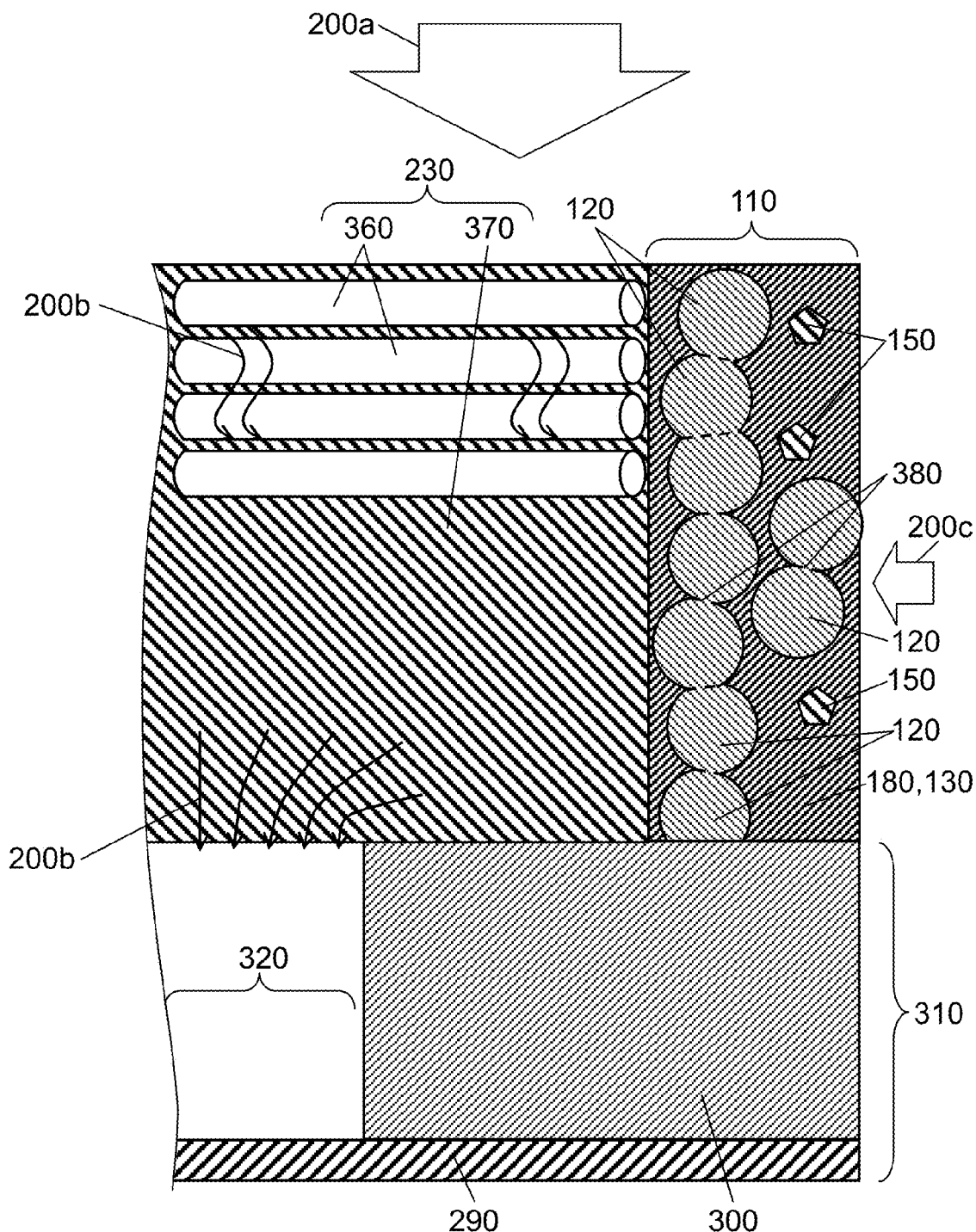
FIG. 12 is a typical sectional view for explaining the state of the via paste according to the embodiment of the present invention.
Figure 13:
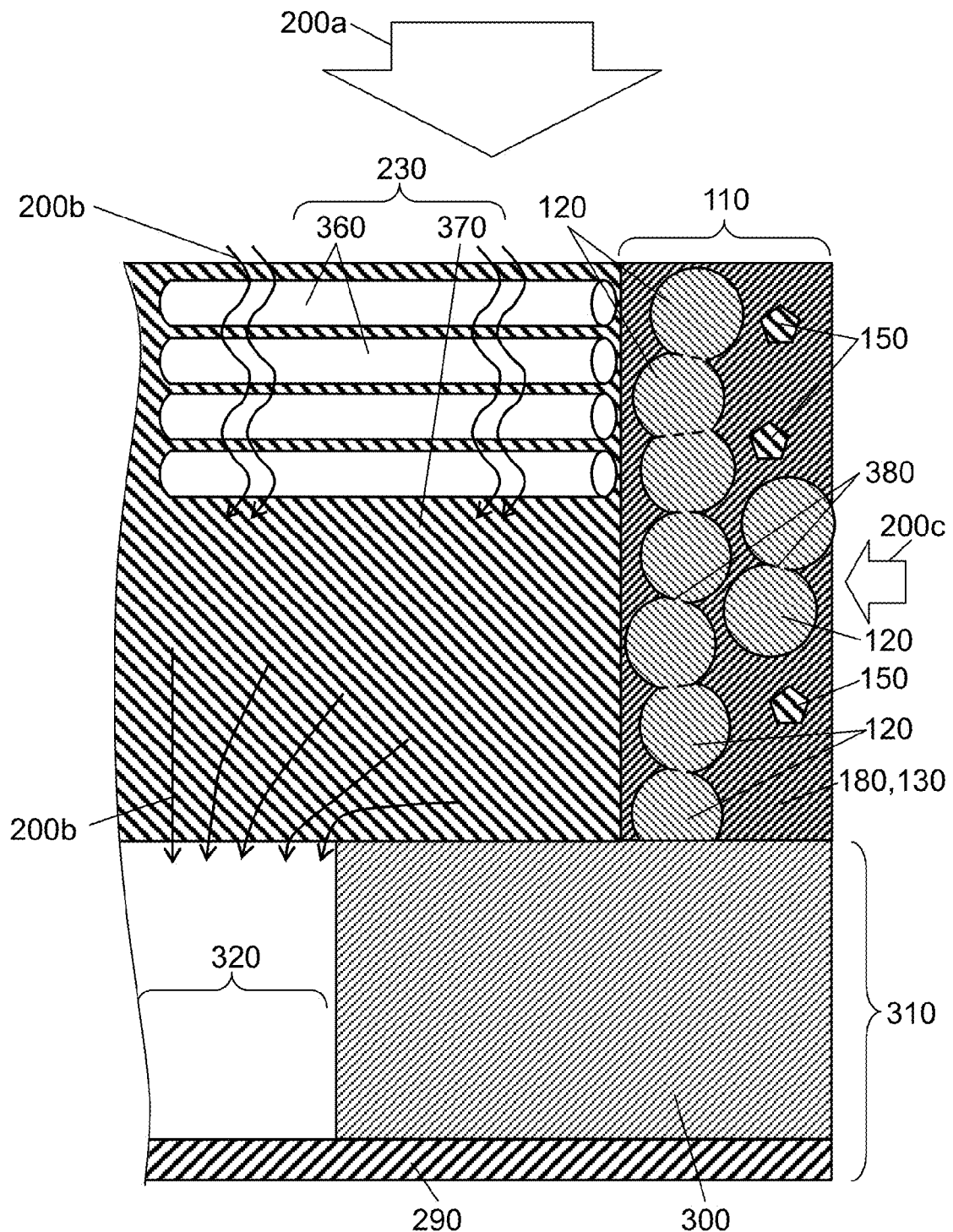
FIG. 13 is a typical sectional view for explaining the state of the via paste according to the embodiment of the present invention.
Figure 14:
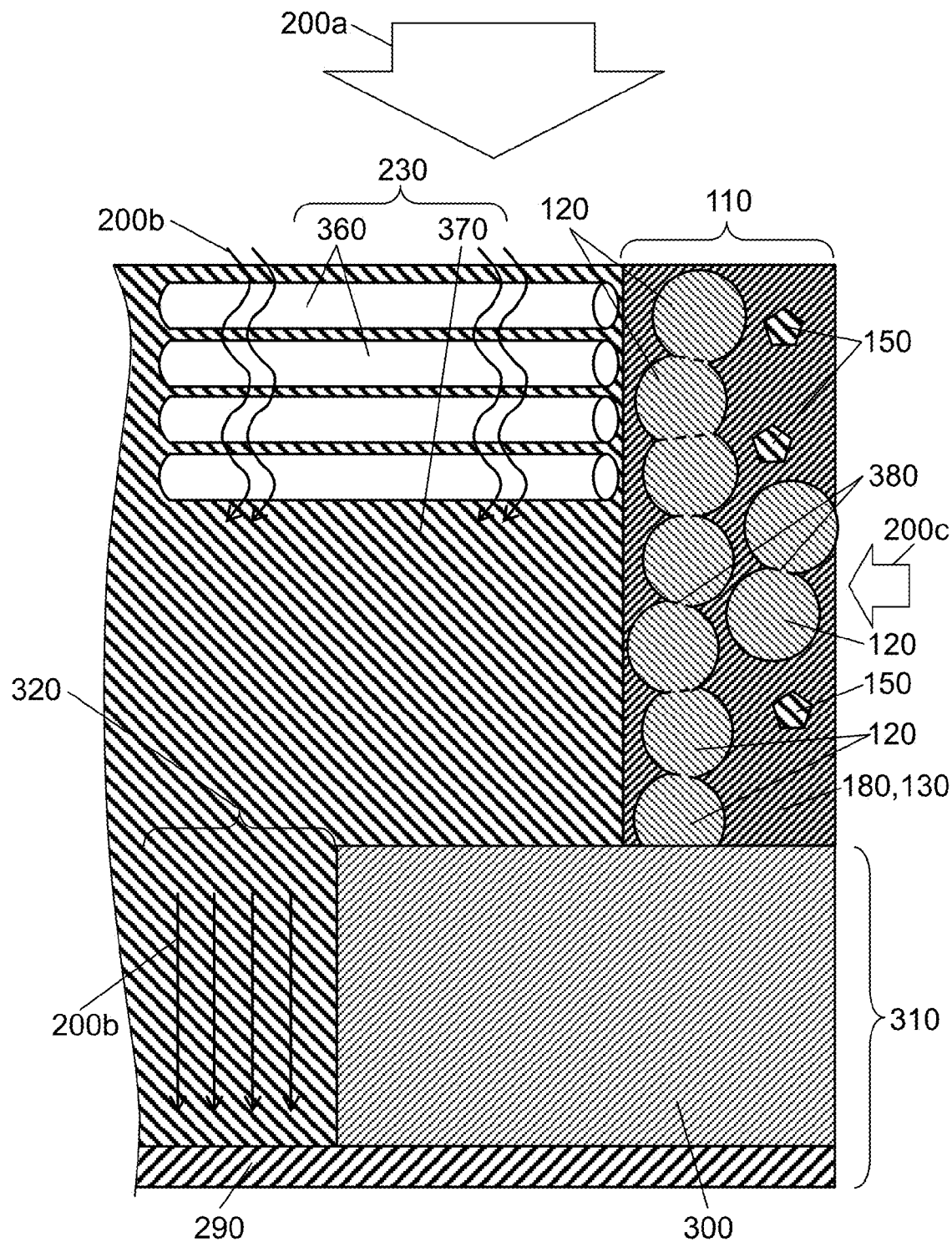
FIG. 14 is a typical sectional view for explaining the state of the via paste according to the embodiment of the present invention.

An end on the low temperature side of flat region 210 is set into a higher temperature than Ts1 (and furthermore, a higher temperature than Tp1) and an end on the high temperature side of flat region 210 is set to be less than Tp2 (and furthermore, less than Ts2). In the case in which mass production is taken into consideration, it is desirable that the end on the low temperature side of flat region 210 should be equal to or higher than 50° C. and the end on the high temperature side should be equal to or lower than 180° C. Furthermore, it is desirable that a temperature range of the flat region (more specifically, a range in which the change in the viscosity is small, that is, ±two digits) should be equal to or higher than 5° C. (and furthermore, be equal to or higher than 10° C.) and be equal to or lower than 80° C. In some cases in which a range of flat region 210 (a range with respect to a temperature axis in FIG. 4) is smaller than 5° C., a filling property of clearance 320 through softened prepreg resin 370 which will be described later with reference to FIGS. 12 to 14 is influenced. In some cases in which a range of flat region 210 is more than 80° C., moreover, it is hard to use an inexpensive epoxy resin or the like for prepreg resin 370.

Figure 7A:
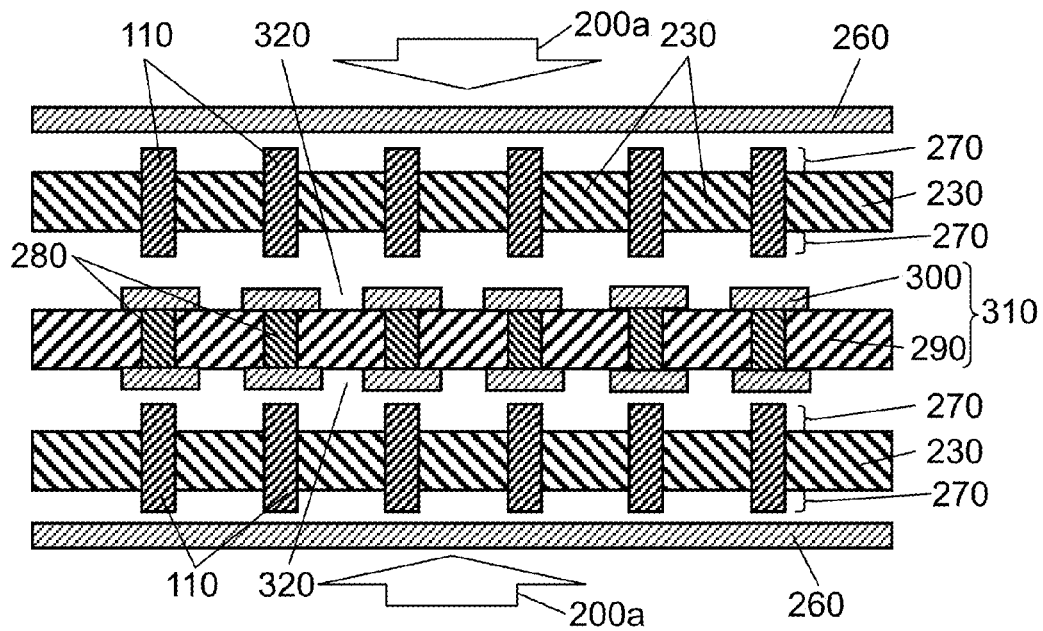
FIG. 7A is a typical sectional view showing the method of manufacturing a circuit board according to the embodiment of the present invention.
Figure 7B:
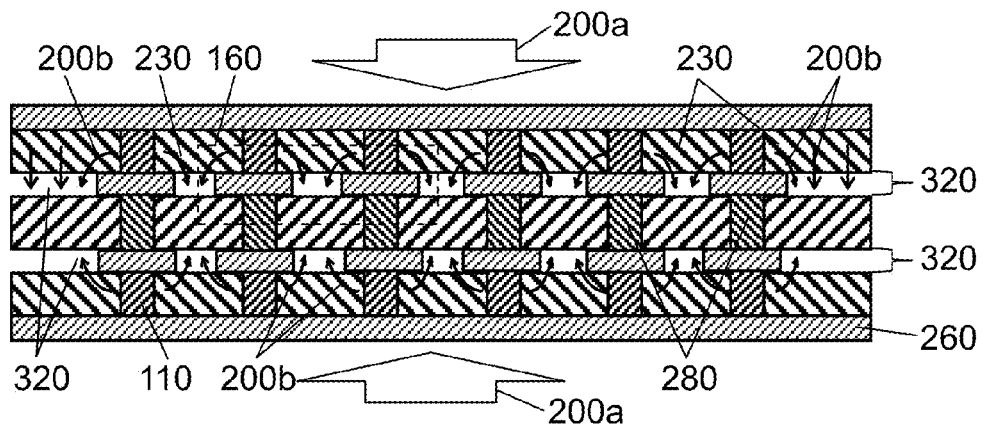
FIG. 7B is a typical sectional view showing the method of manufacturing a circuit board according to the embodiment of the present invention.
Figure 7C:
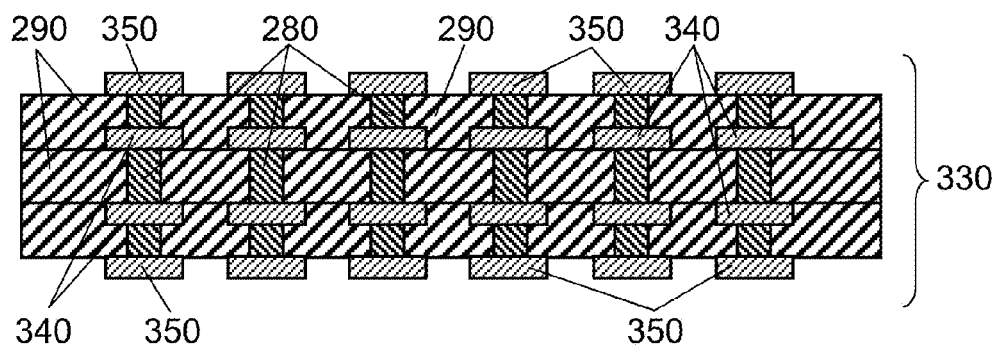
FIG. 7C is a typical sectional view showing the method of manufacturing a circuit board according to the embodiment of the present invention.

Thus, as shown in FIGS. 7A to 7C which will be described later, the present embodiment relates to core substrate portion 310 having first wiring 340 provided on at least a surface layer, second wiring 350 laminated, on core substrate portion 310, through insulating layer 290 formed of a cured product of prepreg 230, and via paste 110 filled in hole 240 formed on insulating layer 290 and electrically connecting first wiring 340 and second wiring 350. Via paste 110 has at least first latent curing agent 140 and second latent curing agent 150 which are solid together, uncured resin mixture 130 to be cured by first latent curing agent 140 and second latent curing agent 150, and conductive particle 120. Both of melting points of first latent curing agent 140 and second latent curing agent 150 are equal to or higher than 40° C. and are equal to or lower than 200° C., and are different from each other within a range of 10° C. to 140° C. Consequently, it is possible to eliminate drawbacks, that is, an increase in a via resistance or an increase in a variation in the via resistance which is caused by deformation of via paste 110 in the case in which a via diameter is decreased.

Next, description will be given to a circuit board using via paste 110 and a method of manufacturing the same. With reference to FIGS. 5A to 7C, description will be given to a multilayer circuit board using via paste 110 and a method of manufacturing the same. FIGS. 5A to 6C show a method of manufacturing core substrate portion 310 to be a part (or a core portion) of a circuit board using via paste 110. In the manufacture of core substrate portion 310, in some cases in which a conventional via paste is used in place of via paste 110, a plating via portion is influenced by deformation or the like in heating press.

FIGS. 5A to 7C are typical sectional views showing the method of manufacturing a circuit board according to the embodiment of the present invention.

Figure 5A:
FIG. 5A is a typical sectional view showing a method of manufacturing a circuit board according to the embodiment of the present invention.

First of all, as shown in FIG. 5A, protective film 220 is bonded to both surfaces of prepreg 230. In the present embodiment, prepreg 230 has a core (not shown) constituted by a glass woven fabric, a nonwoven fabric, or the like, and a prepreg resin (not shown) in a semi-curing state which is impregnated in the core.

As protective film 220, various resin films are used. A specific example of protective film 220 includes resin films such as PET (polyethylene terephthalate) and PEN (polyethylene naphthalate). It is preferable that the resin film should have a thickness of 0.5 μm to 50 μm, and furthermore, 1 μm to 30 μm. In the case of the thickness described above, protruded portion 270 constituted by via paste 110 having a sufficient height can be exposed by peeling of protective film 220 as will be described below.

For instance, a method of bonding protective film 220 to prepreg 230 includes a direct bonding method using a surface tacking property of an uncured prepreg resin (or in a semi-curing state) exposed to the surface of prepreg 230 (which is not shown).

Figure 5B:
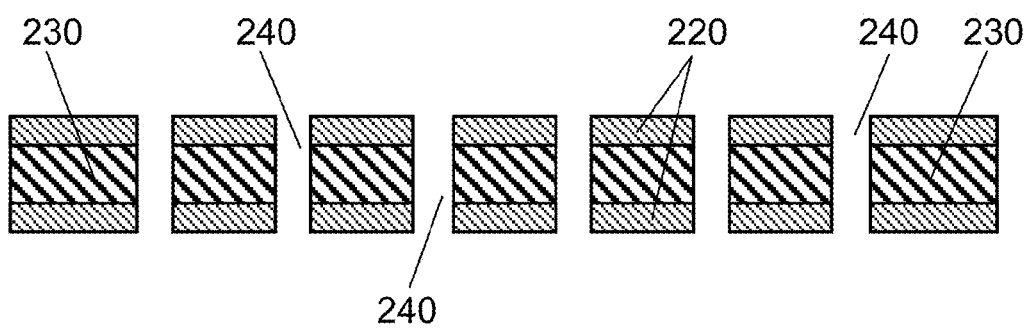
FIG. 5B is a typical sectional view showing the method of manufacturing a circuit board according to the embodiment of the present invention.

As shown in FIG. 5B, next, prepreg 230 provided with protective film 220 is perforated at an outside of protective film 220 to form hole 240. For the perforation, there are used various methods such as perforation using a drill in addition to a non-contact processing method through a carbon dioxide laser, a YAG laser or the like. Hole 240 formed by penetration has a diameter of approximately 10 μm to 500 μm, and furthermore, approximately 50 μm to 300 μm.

Figure 5C:
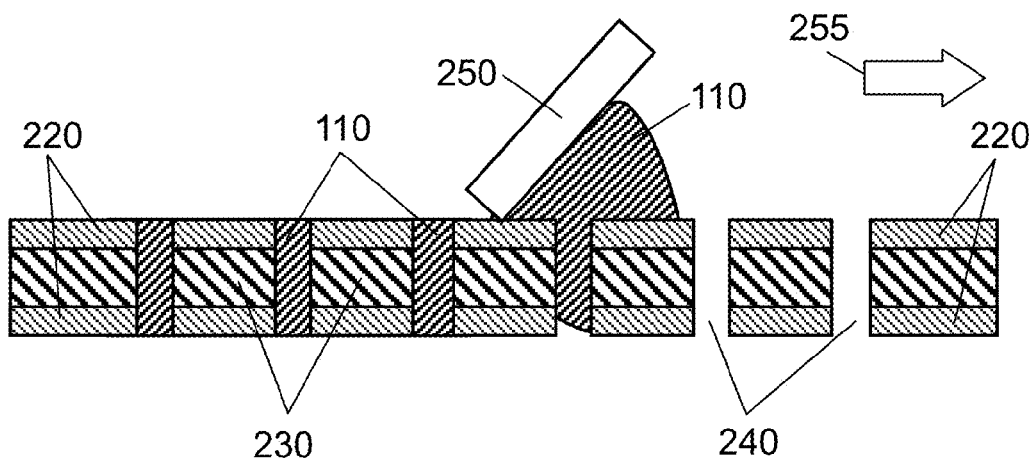
FIG. 5C is a typical sectional view showing the method of manufacturing a circuit board according to the embodiment of the present invention.

As shown in FIG. 5C, subsequently, squeegee 250 is moved in a direction of arrow 255 to fully fill hole 240 with via paste 110. Via paste 110 contains conductive particle 120 (although not shown in the figure, Cu powder, for example), uncured resin mixture 130, and first latent curing agent 140 and second latent curing agent 150 which are solid together. For squeegee 250, it is possible to use squeegee formed of rubber which is used in general screen printing.

It is preferable that an average particle diameter of conductive particle 120 formed by a Cu particle or the like should be in a range of 0.1 μm to 20 μm, and furthermore, 1 μm to 10 μm. In the case in which the average particle diameter of conductive particle 120 such as a Cu particle is excessively small, conductive particle 120 is highly filled in hole 240 with difficulty. Moreover, conductive particle 120 having a small particle diameter is expensive. On the other hand, in the case in which the average particle diameter of conductive particle 120 constituted by the Cu particle or the like is excessively large, the filling is carried out with difficulty when a via hole conductor having a small diameter is to be formed.

In addition, a particle shape of conductive particle 120 constituted by the Cu particle or the like is not particularly restricted. More specifically, a spherical shape, a flat shape, a polygonal shape, a shape of a scaled piece, a flake shape, a shape having a projection on a surface, or the like is taken as an example. Moreover, a primary particle or a secondary particle may be formed.

A method of filling via paste 110 is not particularly restricted. More specifically, a method such as screen printing is used, for example. In the manufacturing method according to the present embodiment, in the case in which hole 240 is filled with via paste 110, it is necessary to carry out the filling in such a quantity as to overflow from hole 240 formed on prepreg 230 in such a manner that a part of via paste 110 is protruded from hole 240 formed on prepreg 230 and protruded portion 270 is thus exposed when protective film 220 is peeled after the filling step.

Figure 6A:
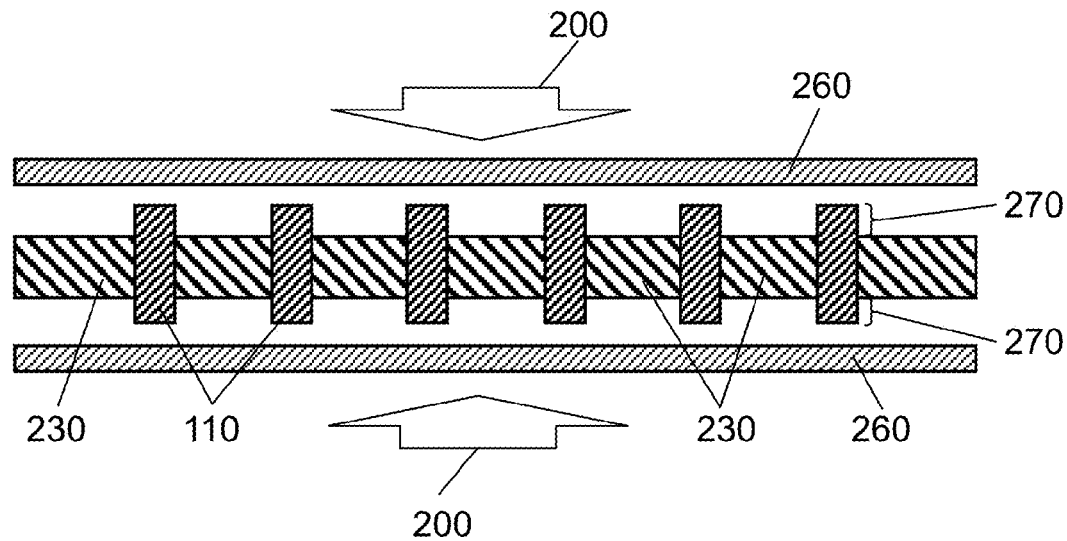
FIG. 6A is a typical sectional view showing the method of manufacturing a circuit board according to the embodiment of the present invention.

As shown in FIG. 6A, next, protective film 220 is peeled from the surface of prepreg 230 to protrude a part of via paste 110 as protruded portion 270 from hole 240. It is preferable that a height of protruded portion 270 should be 0.5 μm to 50 μm, and furthermore, 1 μm to 30 μm, for example, depending on a thickness of protective film 220. In the case in which the height of protruded portion 270 is excessively great, there is a possibility that the paste might overflow around hole 240 on the surface of prepreg 230 to lose a surface smoothness at a press bonding step which will be described below. In the case in which the height of protruded portion 270 is excessively small, there is a possibility that a pressure might not be sufficiently transmitted to via paste 110 to be filled at the press bonding step which will be described below.

Figure 6B:
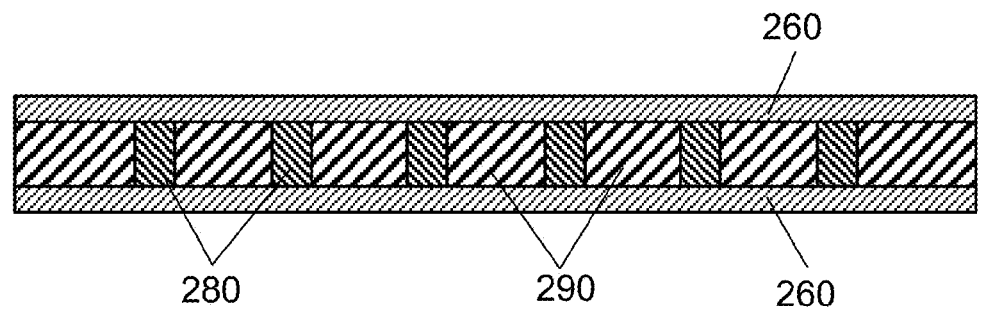
FIG. 6B is a typical sectional view showing the method of manufacturing a circuit board according to the embodiment of the present invention.

As shown in FIG. 6A, copper foil 260 is disposed on prepreg 230 and is pressed in a direction shown in arrow 200. As shown in FIG. 6B, consequently, prepreg 230 and copper foil 260 are integrated so that insulating layer 290 is formed. At the beginning of the press, a force is applied to protruded portion 270 through copper foil 260. Therefore, via paste 110 filled in hole 240 is compressed at a high pressure. Thus, an interval between conductive particles 120 (not shown) contained in via paste 110 is reduced so that conductive particles 120 are deformed and come in face contact with each other to form via 280.

Although a pressing condition is not particularly restricted, it is desirable that pressurization through pressing should be started at a temperature which is equal to or higher than an ordinary temperature (20° C.) and is lower than the melting point of first latent curing agent 140 (or is lower than a reaction starting temperature), temperature Ts1 of FIG. 2A, or a temperature which is lower than temperature Ts1 of FIG. 3A.

As shown in FIG. 6A, protruded portion 270 which is protruded from hole 240 formed on prepreg 230 is pressed through copper foil 260 so that via paste 110 filled in hole 240 is compressed and conductive particles 120 thus come in contact with each other. In the compression, conductive particles 120 come in point contact with each other at the beginning and are then crushed with an increase in a pressure so that they are deformed and come in face contact with each other to form face contact portion 380 (not shown). Consequently, a large number of conductive particles 120 come in face contact with each other to electrically connect copper foil 260 serving as an upper wiring and copper foil 260 serving as a lower wiring in a low resistance state.

Thus, there is formed via 280 for carrying out an interlayer connection between the upper wiring and the lower wiring.

Figure 6C:
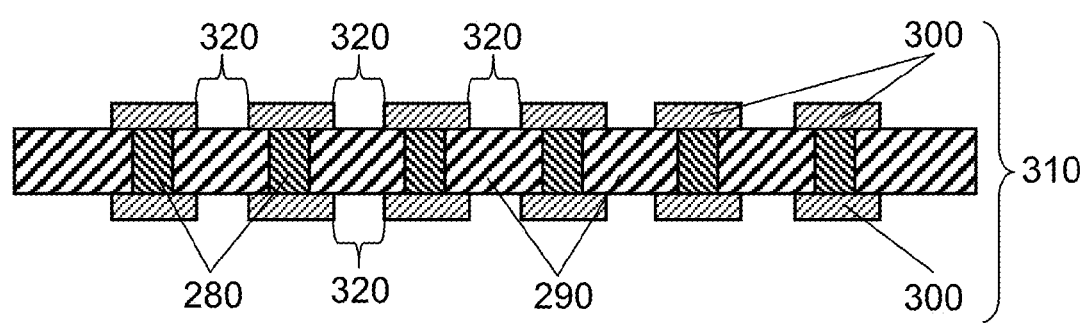
FIG. 6C is a typical sectional view showing the method of manufacturing a circuit board according to the embodiment of the present invention.

As shown in FIG. 6C, next, wiring 300 is formed on at least one surface. Wiring 300 is provided by forming a photoresist film on a surface of copper foil 260 bonded to a surface layer and carrying out selective exposure through a photomask to perform patterning, then performing development, selectively removing copper foil 260 in a portion other than the wiring portion through etching and thereafter removing the photoresist film. For the formation of the photoresist film, it is also possible to use a liquid resist or a dry film.

By the steps, there is obtained core substrate portion 310 including insulating layer 290, wirings 300 formed on both surfaces of insulating layer 290, that is, wirings 300 formed with clearance 320 therebetween, and via 280 for connecting wirings 300.

With reference to FIGS. 7A to 7C, next, description will be given to a state in which core substrate portion 310 is further multilayered to manufacture the multilayered circuit board according to the present embodiment.

First of all, as shown in FIG. 7A, prepreg 230 having the same protruded portion 270 constituted by via paste 110 as that obtained in FIG. 6A and copper foil 260 are disposed and superposed on wiring 300 side of core substrate portion 310 respectively to form a superposed body (not shown). The superposed body is inserted into a press mold (not shown) and is pressed in a direction shown in arrow 200a and heated so that a laminated body shown in FIG. 7B is obtained.

Then, new wiring 350 is formed on a surface layer by using the photoprocess described above. By further repeating the multilayer process, multilayered circuit board 330 is obtained.

As shown in FIG. 7B, thereafter, a prepreg resin (not shown) impregnated in prepreg 230 is caused to flow in a direction of arrow 200b and is thus embedded in clearance 320 between wirings 300 formed to be protruded from one of the surfaces of core substrate portion 310.

As shown in a portion surrounded by additional line 160 of FIG. 7B, the prepreg resin (not shown) in prepreg 230 permeates as shown in arrow 200b into clearance 320 formed between wirings 300 provided on one of the surfaces of core substrate portion 310, thereby filling clearance 320.

In the case in which the thickness of prepreg 230 is small or wirings 300 provided on one of the surfaces of core substrate portion 310 have a fine pattern, it is necessary to further reduce the viscosity of the prepreg resin in order to fill fine clearance 320 with the prepreg resin or to apply a strong pressurizing force in a direction shown in arrow 200a of FIG. 7B, for example, in order to push the prepreg resin into every corner of clearance 320. The case in which the thickness of the prepreg 230 is small represents the case in which the thickness is equal to or smaller than 100 μm, and furthermore, is equal to or smaller than 50 μm or is equal to or smaller than 30 μm, for example. When the viscosity of the prepreg resin is reduced more greatly and clearance 320 between wirings 300 is filled with the prepreg resin by a further strong pressurizing force, there is a possibility that a part of via paste 110 might be caused to flow away by the flow of the prepreg resin as shown in additional line 15 of FIG. 24C described above.

In via paste 110 according to the present embodiment, even if the thickness of prepreg 230 is reduced, via paste 110 is not deformed also in the case in which the viscosity of the prepreg resin is further decreased more greatly than in the conventional art and clearance 320 between wirings 300 is filled with the prepreg resin by a strong pressurizing force.

FIG. 7C is a sectional view showing circuit board 330 according to the present embodiment which is thus fabricated. By repeating the steps of FIGS. 7A to 7C at a necessary number of times, moreover, it is possible to handle a further enhancement in a multilayer.

In FIG. 7C, first wiring 340 is a wiring provided to be protruded from the surface of core substrate portion 310. Circuit board 330 has second wiring 350 laminated on core substrate portion 310 through insulating layer 290 formed of a cured product of prepreg 230, and via 280 filled in hole 240 formed on insulating layer 290, electrically connecting first wiring 340 and second wiring 350, and formed of a cured product of via paste 110. Via paste 110 has at least first latent curing agent 140 and second latent curing agent 150 which are solid together, uncured resin mixture 130 to be cured by first latent curing agent 140 and second latent curing agent 150, and conductive particle 120. Both of the melting points of first latent curing agent 140 and second latent curing agent 150 are equal to or higher than 40° C. and are equal to or lower than 200° C., and are different from each other within a range which is equal to or higher than 10° C. and is equal to or lower than 140° C. With this structure, the deformation of via paste 110 is suppressed so that circuit board 330 having an excellent reliability is obtained.

With reference to FIGS. 8 to 15, next, further detailed description will be given to the reason why via paste 110 is filled in a prepreg and is not deformed when a via serving as an interlayer connection is to be constituted.

FIGS. 8 to 15 correspond to enlarged sectional views illustrating the portion shown in additional line 160 of FIG. 7B, for example.

Figure 8:
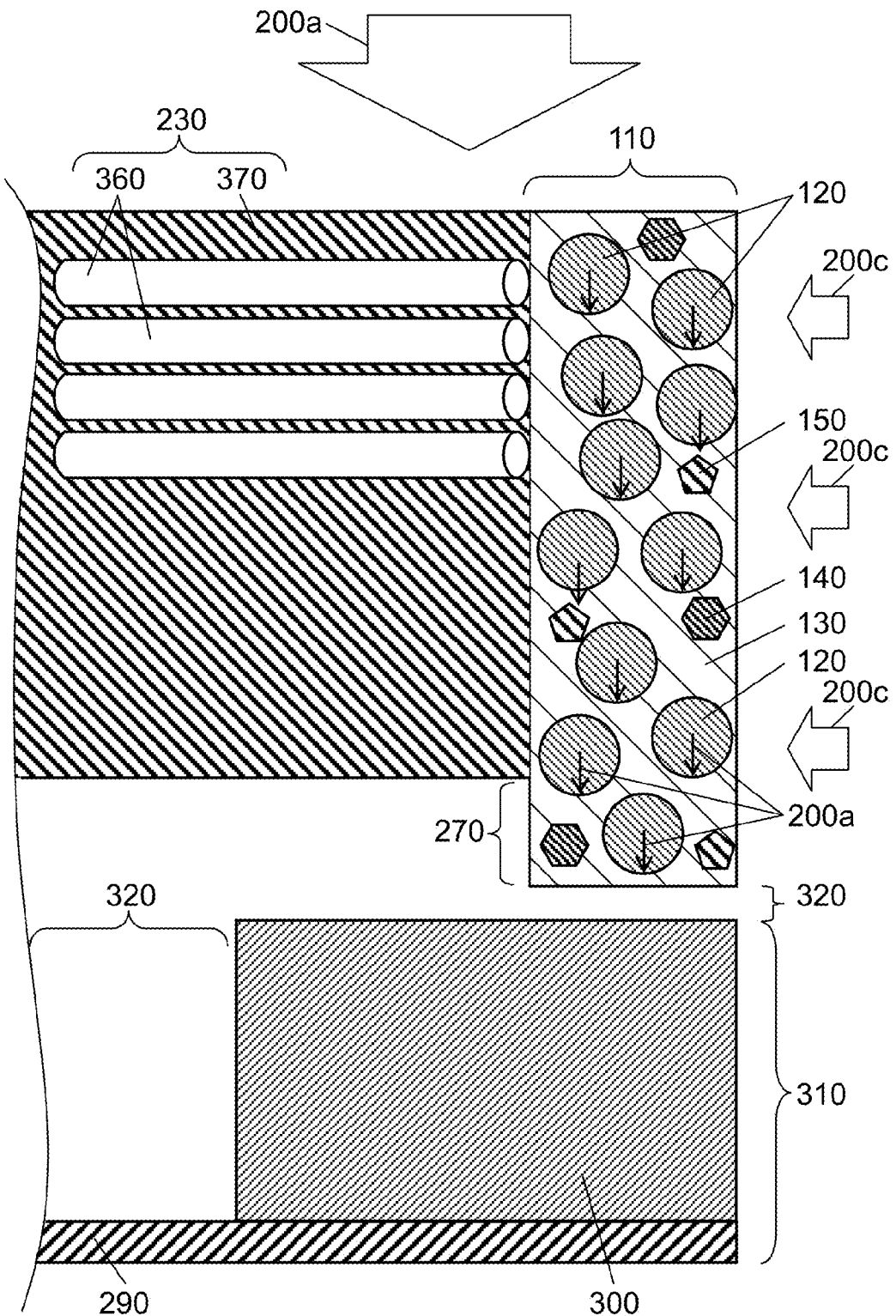
FIG. 8 is a typical sectional view for explaining a state of the via paste according to the embodiment of the present invention.

FIG. 8 is a sectional view showing a state in which prepreg 230 having a part of via paste 110 serving as protruded portion 270 is pushed against wiring 300 formed on one of the surfaces of core substrate portion 310, and corresponds to a sectional view showing a part of FIG. 7A which is enlarged, for example.

As shown in FIG. 8, prepreg 230 has core 360 (a woven fabric constituted by a resin fiber such as a glass fiber or aramid, or a nonwoven fabric), and a resin in a semi-curing state which is constituted by an epoxy resin impregnated in core 360 or the like (hereinafter, referred to as prepreg resin 370).

FIG. 8 shows a state brought before a start of a curing reaction of via paste 110 at a lower temperature than Ts1 of FIG. 2A from the vicinity of a room temperature (20° C.). In FIG. 8, via paste 110 has not been cured, and via paste 110 contains first latent curing agent 140 and second latent curing agent 150 which are set in a solid state together, conductive particle 120 and uncured resin mixture 130.

Moreover, clearance 320 is present between protruded portion 270 constituted by via paste 110 and wiring 300 formed on the surface of core substrate portion 310 (which is shown as first wiring 340 in FIG. 7C).

As shown in arrow 200a of FIG. 8, then, these members are pressurized. It is desirable that the pressurization should be carried out at a lower temperature than Ts1 (see FIG. 2 or the like) from the vicinity of the room temperature (20° C.). The pressurization is carried out within the temperature range to bring a state in FIG. 9.

Figure 9:
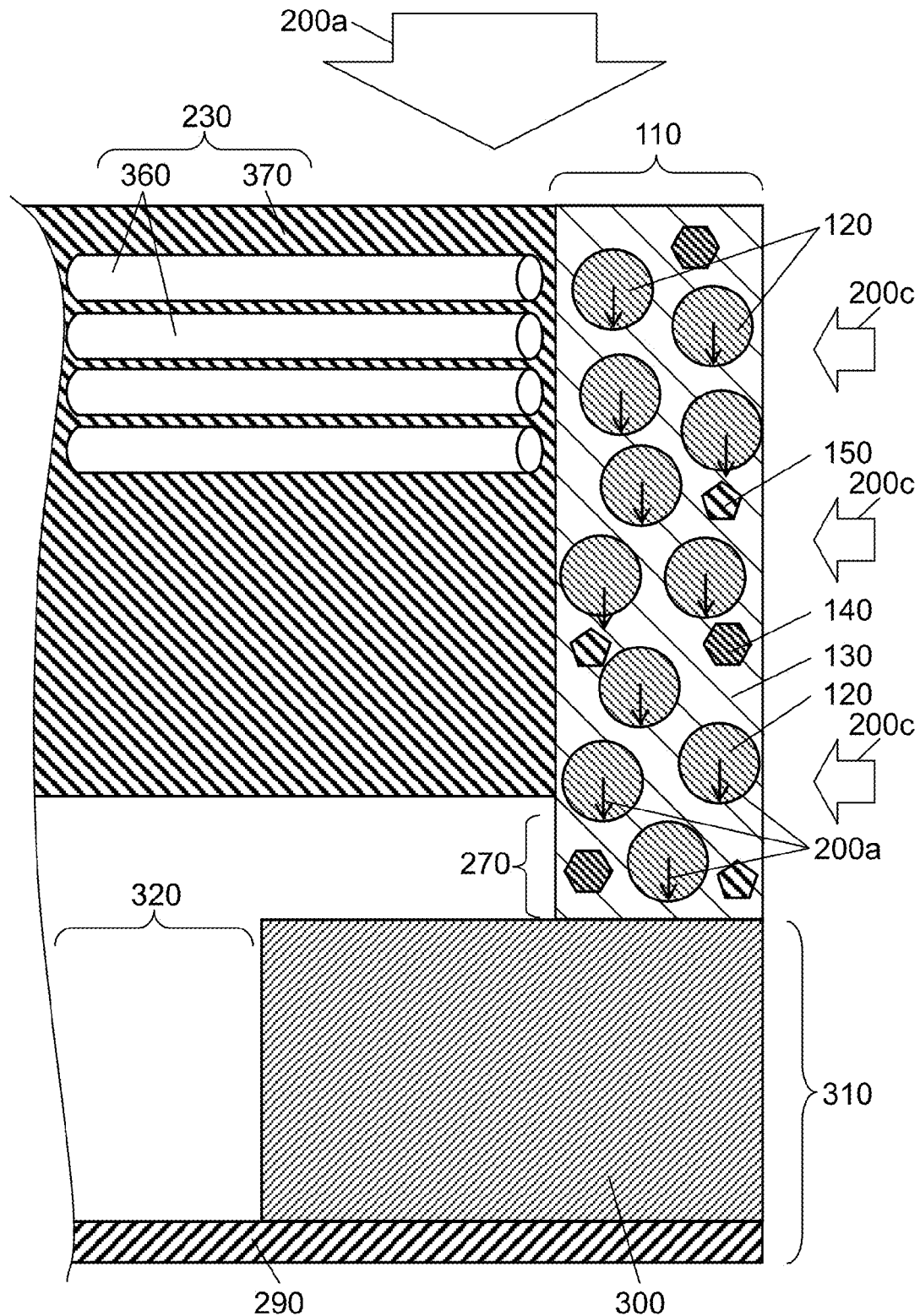
FIG. 9 is a typical sectional view for explaining the state of the via paste according to the embodiment of the present invention.

FIG. 9 is a sectional view showing a state in which protruded portion 270 constituted by via paste 110 and wiring 300 formed on the surface of core substrate portion 310 come in contact with each other. It is desirable that the pressurization should be carried out at a lower temperature than Ts1 (see FIG. 2 or the like) from the vicinity of the room temperature (20° C.) in the same manner as in FIG. 8. By further carrying out the pressurization continuously, a state in FIG. 10 is brought.

Figure 10:
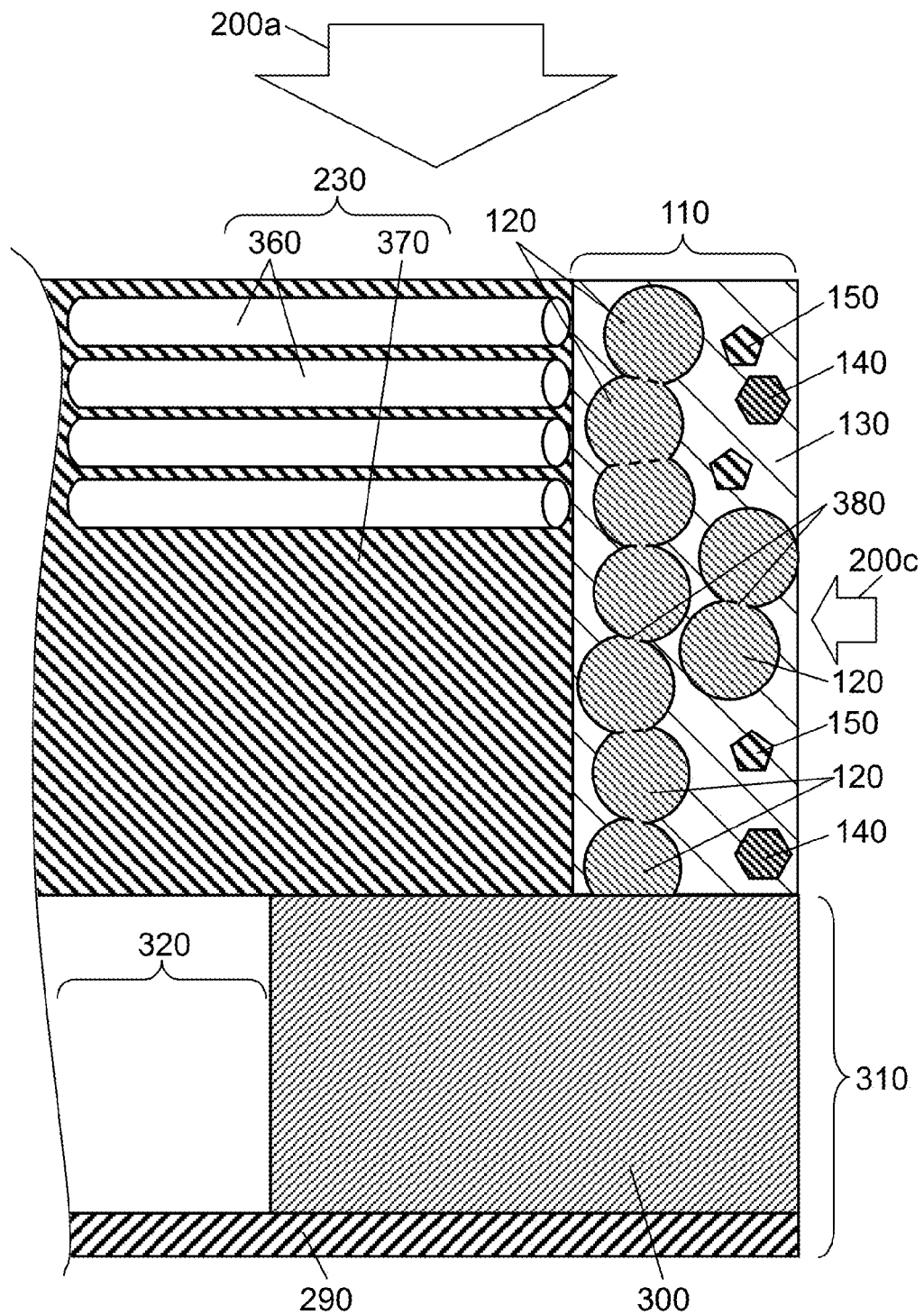
FIG. 10 is a typical sectional view for explaining the state of the via paste according to the embodiment of the present invention.

FIG. 10 is a sectional view showing a state in which via paste 110 is pressurized and conductive particles 120 added to an inner part thereof are pressurized as shown in arrow 200a and are electrically conducted through face contact portion 380 formed by mutual deformation. It is desirable that the pressurization should be carried out at a lower temperature than Ts1 (see FIG. 2 or the like) from the vicinity of the room temperature (20° C.) in the same manner as in FIGS. 8 and 9.

Figure 11:
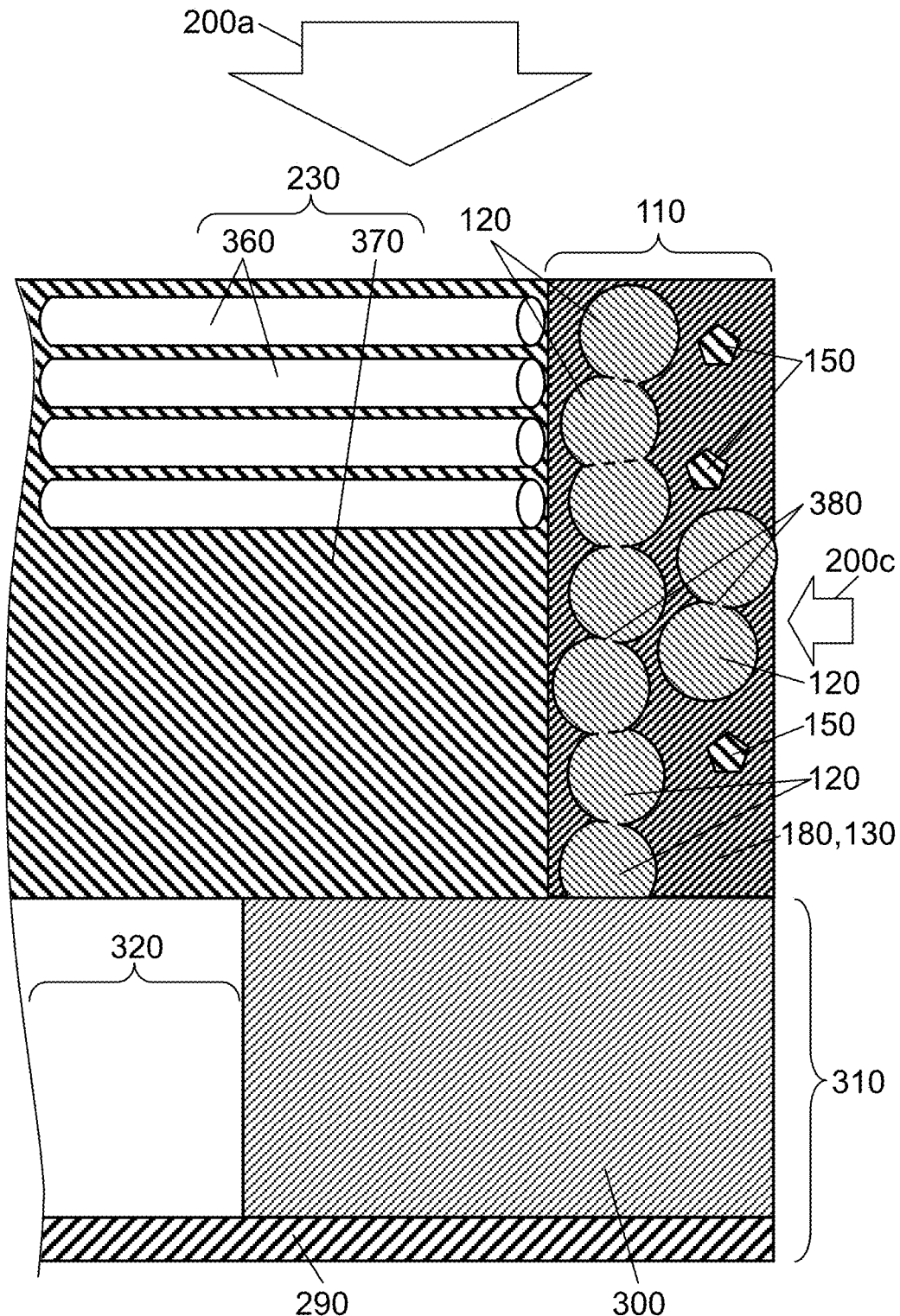
FIG. 11 is a typical sectional view for explaining the state of the via paste according to the embodiment of the present invention.

The pressurization is continuously carried out in this state and these members are heated up to Ts1 or more (and furthermore, approximately Tp1, for example, a range of Tp1 ±10° C. or less) to bring a state in FIG. 11.

FIG. 11 shows a state in which first solid latent curing agent 140 in via paste 110 is molten or softened, or develops a reactivity and carries out a curing reaction to a part of uncured resin mixture 130 so that first cured product 180 is formed. As shown in FIG. 11, it is desirable that first cured product 180 and uncured resin mixture 130 should be coexistent with each other in addition to second solid latent curing agent 150. In order for uncured resin mixture 130 which does not completely react but remains to be coexistent with first cured product 180, it is desirable that an epoxy equivalent weight of first latent curing agent 140 should be 10% or more and 90% or less in an epoxy equivalent weight of uncured resin mixture 130 (in addition, 20% or more and 80% or less, moreover, 30% or more and 70% or less, or 40% or more and 60% or less, and furthermore, 45% or more and 55% or less).

By further carrying out the heating continuously, then, prepreg resin 370 contained in prepreg 230 is softened and thus embedded in clearance 320 of core substrate portion 310 or the like.

FIG. 12 shows a state in which heating is carried out up to Tp1 or more so that prepreg resin 370 contained in prepreg 230 is softened and caused to flow as shown in arrow 200b through a clearance between cores 360 and the like. In FIG. 12, via paste 110 is not influenced by the flow of prepreg resin 370 contained in prepreg 230 through the presence of first cured product 180 contained therein. Moreover, uncured resin mixture 130 remaining without the formation of first cured product 180 by a reaction is coexistent with first cured product 180. Even if first cured product 180 has been cured, uncured resin mixture 130 is present. For this reason, it is possible to relieve a stress against an external force. Consequently, first cured product 180 is prevented from being broken by a compressive force in arrow 200a or the like. Then, the heating is further carried out continuously if necessary so that prepreg resin 370 contained in prepreg 230 is further softened into a low viscosity to enhance a flowability thereof and clearance 320 is thus filled up as shown in FIG. 13. Consequently, a state in FIG. 14 is brought.

In FIG. 14, a clearance between prepreg 230 and core substrate portion 310 (particularly, clearance 320 between wirings 300) is heated to be equal to or higher than Ts1 (and furthermore, be equal to or higher than Tp1), and is thus filled with softened prepreg 370. Moreover, a part of uncured resin mixture 130 is moved to prepreg 230 side so that a volume density of conductive particle 120 in via 280 is further increased.

Then, the heating is carried out up to Ts2 or more so that second latent curing agent 150 in the solid state which is contained in via paste 110 is molten (or a reactivity is developed) and a reaction to uncured resin mixture 130 which is coexistent with first cured product 180 is started. In addition, prepreg resin 370 is also cured so that a state shown in FIG. 15 is brought.

Figure 15:
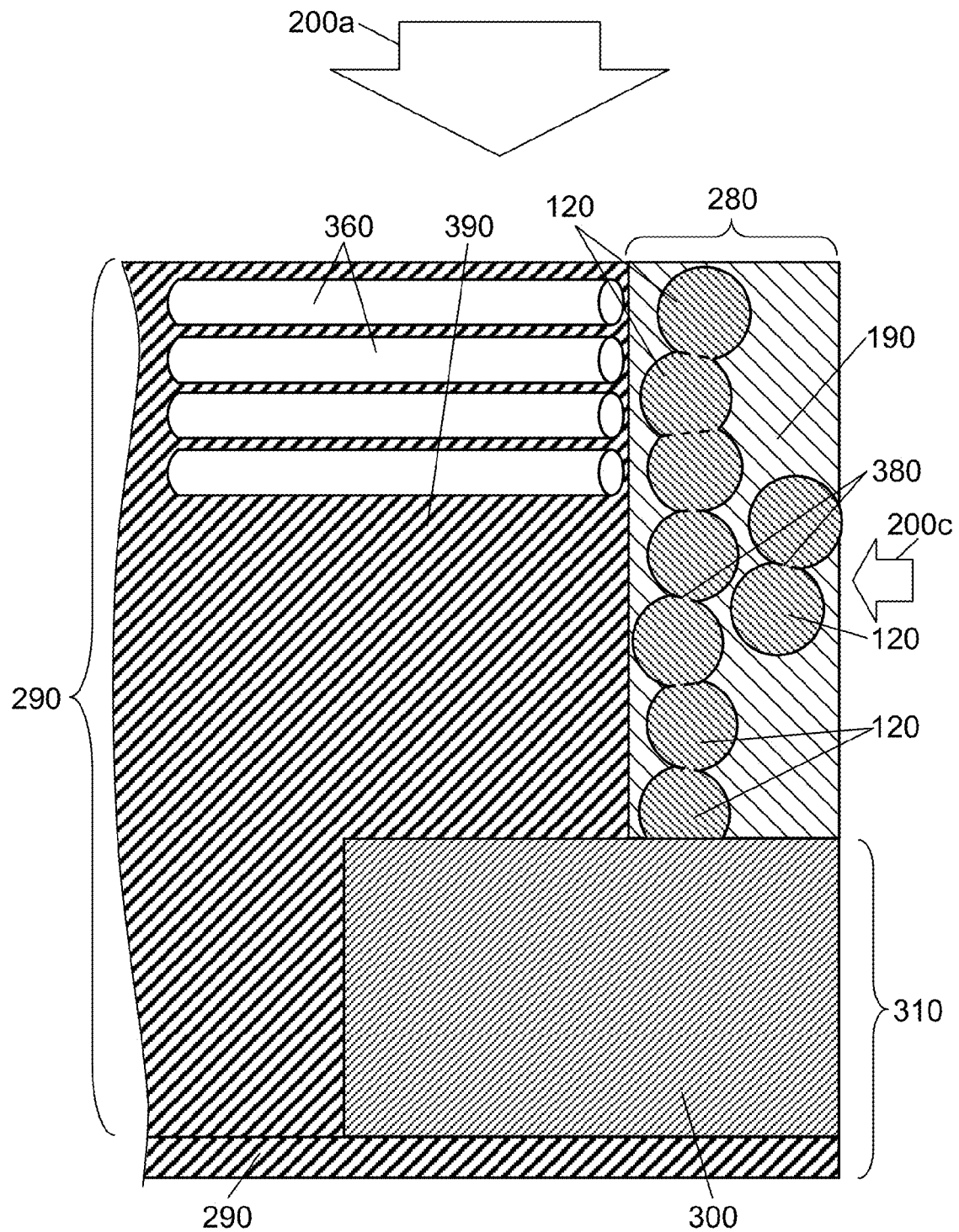
FIG. 15 is a typical sectional view for explaining the state of the via paste according to the embodiment of the present invention.

FIG. 15 is a sectional view showing a state brought after both prepreg 230 and via paste 110 are cured. In FIG. 15, prepreg 370 is cured so that cured prepreg resin 390 is formed.

It is desirable that conductive particles 120 should be caused to come in face contact with each other through face contact portion 380 at a lower temperature than Ts1 in FIG. 2A from the vicinity of the room temperature (20° C.) or in the state shown in FIG. 2B before the curing is started. In some cases in which the temperature is equal to or higher than Ts1 (and furthermore, is equal to or higher than Tp1), a cured product (for example, first cured product 180) of first latent curing agent 140 and uncured resin mixture 130 influences the face contact of the conductive particles (and furthermore, a contact resistance thereof). Moreover, the curing reaction also depends on a temperature rising rate in pressing and heating. For this reason, it is desirable to carry out setting depending on the temperature rising rate, and furthermore, in consideration of a heat conduction speed in a base material or the like.

It is desirable to cause conductive particles 120 to come in contact with each other through face contact portion 380 formed by their mutual deformation in a temperature range of less than Tp1 (and furthermore, less than Ts1) and to then heat via paste 110 up to Ts1 or more, and furthermore, Tp1 or more. By the execution of the heating up to Ts1 or more, first latent curing agent 140 in the solid state is molten to develop the reactivity and reacts to uncured resin mixture 130 so that first cured product 180 can be formed. Prepreg resin 370 softened in subsequent heating fills up clearance 320 between adjacent wirings 300 (or clearance 320 between first wirings 340 provided on the surface of core substrate portion 310 shown in FIG. 7B). At this time, first cured product 180 prevents prepreg resin 370 from flowing to via paste 110, resulting in the deformation of via paste 110. Thereafter, via paste 110 or prepreg 230 is heated up to Ts2 or more (and furthermore, approximately Tp2. Herein, ±10° C. or less, and furthermore, ±5° C. or less are desirable). Consequently, the reaction of uncured resin mixture 130 remaining in via paste 110 and second latent curing agent 150 is started to form cured thermosetting resin 190.

Moreover, it is useful to set the pressurizing and heating steps shown in FIGS. 8 to 15 to be a serial process in respect of a reduction in a control item in a producing process and an enhancement in an efficiency of a work.

In FIGS. 13 and 14, uncured resin mixture 130 which is not completely consumed (or does not completely react) by first latent curing agent 140 is coexistent with first cured product 180. Uncured resin mixture 130 which is coexistent is liquefied at Ts2 or more and carries out a curing reaction to second latent curing agent 150 developing a substantial reactivity to cure via paste 110, thereby forming via 280.

Figure 16A:
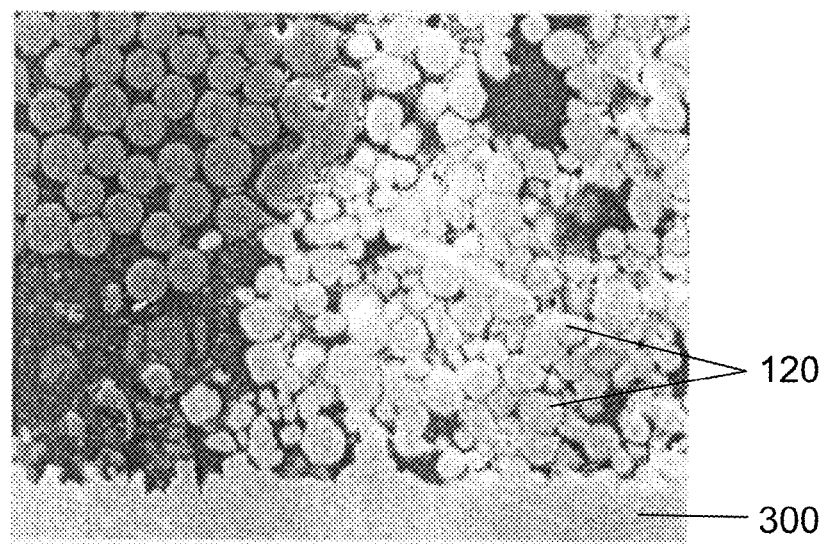
FIG. 16A is a view showing an SEM photograph of a via according to the embodiment of the present invention.
Figure 16B:
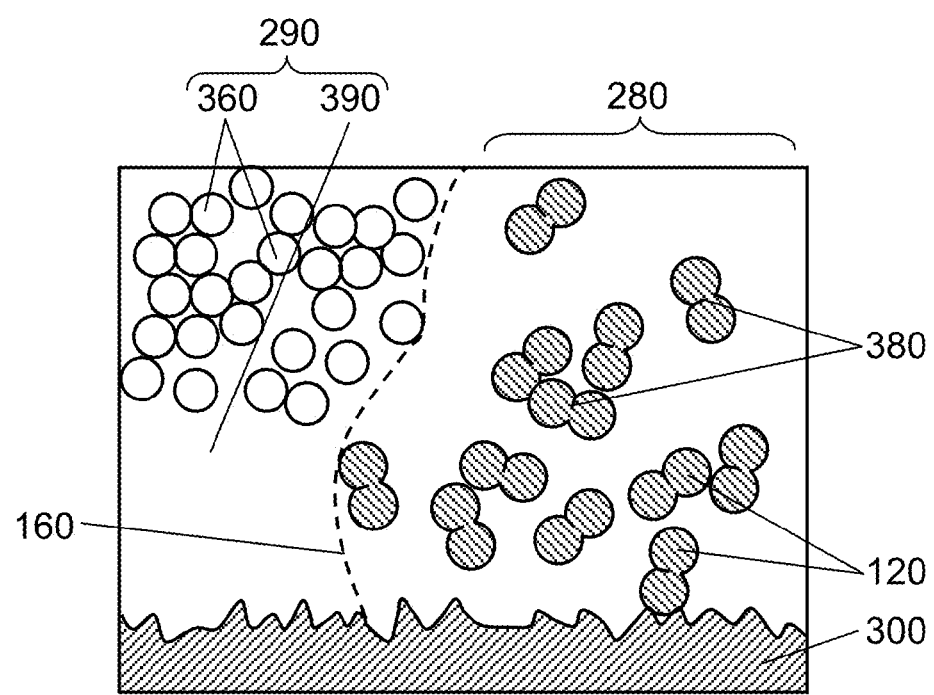
FIG. 16B is a typical top view showing the via according to the embodiment of the present invention.

FIG. 16A is a view showing an SEM photograph of via 280 according to the embodiment of the present invention. FIG. 16B is a typical view showing the same. As shown in FIGS. 16A and 16B, it is apparent that via 280 is rarely influenced by the flow of prepreg resin 370 (illustrated as cured prepreg resin 390 in FIG. 16B) in circuit board 330 using via paste 110.

As shown in FIGS. 16A and 16B, insulating layer 290 has at least core 360 constituted by a glass woven fabric or a nonwoven glass fabric, or an aramid woven fabric or a nonwoven aramid fabric, and cured prepreg resin 390.

It is preferable that an average particle diameter of conductive particle 120 should be in a range of 0.1 μm to 20 μm, and furthermore, 1 μm to 10 μm. In the case in which the average particle diameter of conductive particle 120 is excessively small, there is a tendency that a conduction resistance is increased because the number of contact points is increased in via 280. Moreover, there is a tendency that a particle having a small particle diameter is expensive. On the other hand, in some cases in which the average particle diameter of conductive particle 120 is excessively large, a filling rate is increased with difficulty if small via 280 having a diameter of approximately 100 μm to 150 μm is formed.

It is preferable that a purity of conductive particle 120 should be equal to or higher than 90 mass %, and furthermore, be equal to or higher than 99 mass %. Conductive particle 120 is softer with a higher copper purity thereof. For this reason, conductive particle 120 is apt to be crushed at a pressurizing step which will be described below. Therefore, conductive particles 120 are easily deformed when they come in contact with each other. Thus, a contact area of conductive particles 120 is increased. In the case in which the purity is high, moreover, the resistance value of conductive particle 120 is reduced more greatly, which is preferable.

Referring to the average particle diameter of conductive particle 120 or a structure of face contact portion 380 in which conductive particles 120 come in face contact with each other, the formed circuit board is filled with a resin and a sample fabricated by polishing a section of via 280 is then measured by using a scanning electron microscope (SEM). If necessary, microprocessing means such as FOCUSED ION BEAM is also used.

A large number of conductive particles 120 come in contact with each other to form a conduction path having a low resistance between wirings 300 insulated through insulating layer 290. By the formation of the conduction path, wirings 300 opposed to each other through insulating layer 290 (or between first wiring 340 and second wiring 350 shown in FIG. 7C) are subjected to an interlayer connection with a low interconnection resistance.

Moreover, it is preferable that a large number of conductive particles 120 should randomly come in contact with each other as shown in FIGS. 11 to 15 without their arrangement in order in via 280 to form a complicated network. By forming the network, it is possible to enhance a reliability of an electrical connection. Furthermore, it is preferable that positions in which many conductive particles 120 come in face contact with each other should also be random. By causing conductive particles 120 to come in face contact with each other in the random positions, it is possible to distribute a stress generated in via 280 when receiving heat or an external force applied from an outside through deformation thereof.

It is preferable that a volume rate of conductive particle 120 contained in via 280 should be 30 to 90 volume %, and furthermore, 40 to 70 volume %. In the case in which the volume rate of conductive particle 120 is excessively low, there is a tendency that a reliability of an electrical connection of a conduction path for a coupling member formed by the mutual face contact of many conductive particles 120 is deteriorated. In the case in which the volume rate is excessively high, there is a tendency that a resistance value is apt to fluctuate easily in a reliability test.

On the other hand, cured thermosetting resin 190 constituting via 280 is formed of a cured product of a curing resin. Although the curing resin is not particularly restricted, more specifically, it is especially preferable to employ a cured product of an epoxy resin in respect of an excellent heat resistance and a low coefficient of linear expansion, for example.

It is preferable that a volume rate of cured thermosetting resin 190 in via 280 should be 0.1 to 50 volume %, and furthermore, 0.5 to 40 volume %. In the case in which the volume rate of cured thermosetting resin 190 is excessively high, there is a tendency that a resistance value is increased. In the case in which the volume rate is excessively low, there is a tendency that a preparation of via paste 110 is hard to perform in a manufacture.

As described above, the manufacturing method according to the present embodiment includes a preparing step of preparing core substrate portion 310 having first wirings 340 provided on a surface layer, a step of covering the surface of prepreg 230 with protective film 220, and a step of forming hole 240 formed on prepreg 230 through protective film 220 with penetration. Furthermore, the method includes a step of filling, in hole 240, via paste 110 which has first latent curing agent 140 and second latent curing agent 150 that are solid together, uncured resin mixture 130 to be cured by first latent curing agent 140 and second latent curing agent 150, and conductive particle 120 and in which both of the melting points of first latent curing agent 140 and second latent curing agent 150 are equal to or higher than 40° C. and are different from each other in a range of 10° C. or more and 140° C. or less. Furthermore, the method includes a step of peeling protective film 220, thereby exposing protruded portion 270 formed by the protrusion of a part of via paste 110 from hole 240, and a step of forming first wiring 340 on protruded portion 270 and disposing copper foil 260 to cover protruded portion 270 on an outside.

In addition, the method includes a step of press bonding copper foil 260 to the surface of prepreg 230 and compressing via paste 110 through protruded portion 270, thereby providing face contact portion 380 formed by the mutual face contact of conductive particles 120. Furthermore, a heating step subsequent to the step includes a first heating step of heating via paste 110 up to 40° C. or more, thereby starting a thermal curing reaction of uncured resin mixture 130 and first latent curing agent 140. Moreover, the method includes a second heating step of carrying out heating to a higher temperature than in the first heating step to soften prepreg resin 370 in prepreg 230, thereby filling up clearance 320 between first wirings 340, and a third heating step of starting a thermal curing reaction of uncured resin mixture 130 which remains and second latent curing agent 150.

A comparative example will be described below.

FIRST COMPARATIVE EXAMPLE

Figure 17:
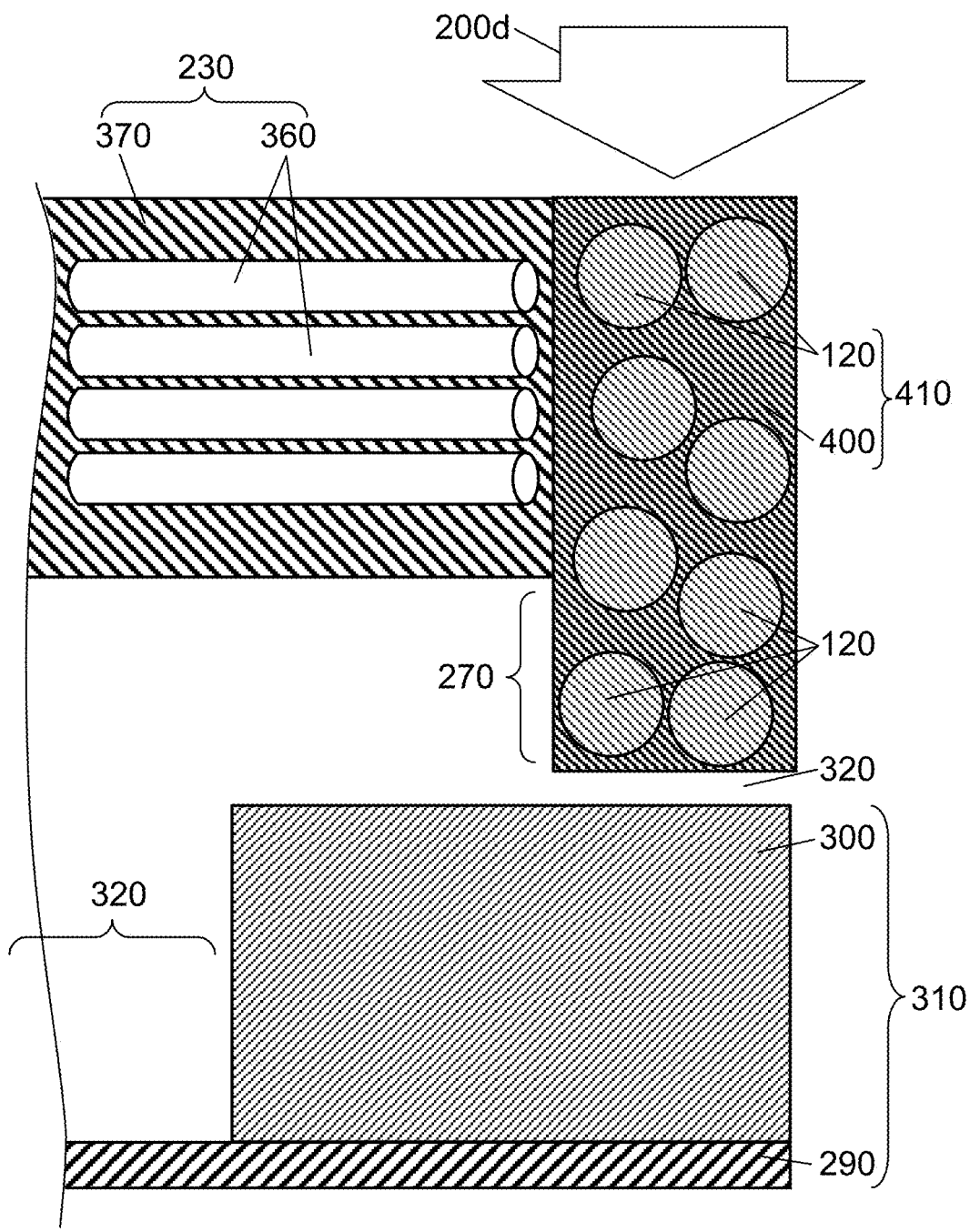
FIG. 17 is a typical sectional view for explaining a state of a via paste according to a first comparative example.
Figure 18:
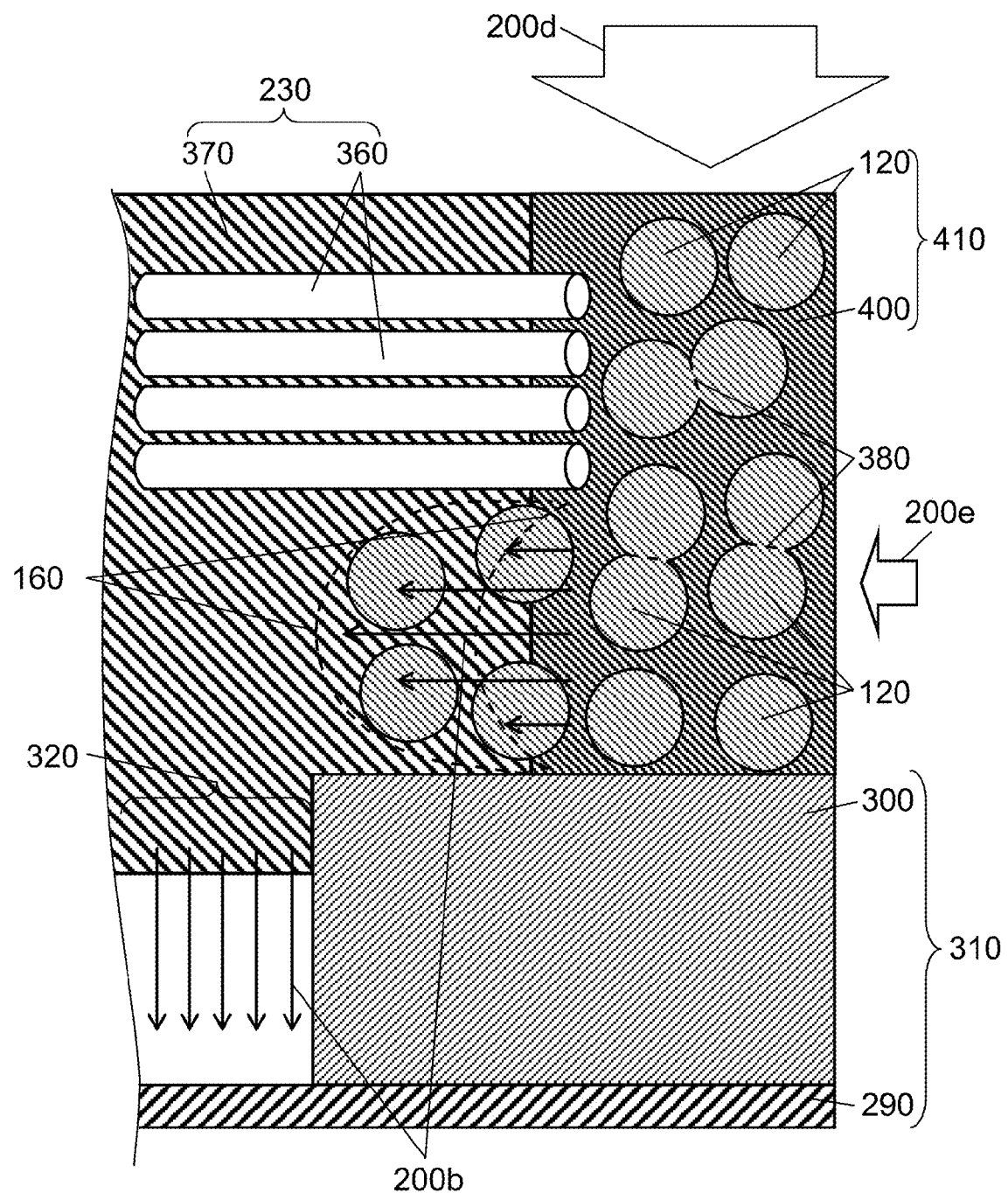
FIG. 18 is a typical sectional view for explaining the state of the via paste according to the first comparative example.
Figure 19:
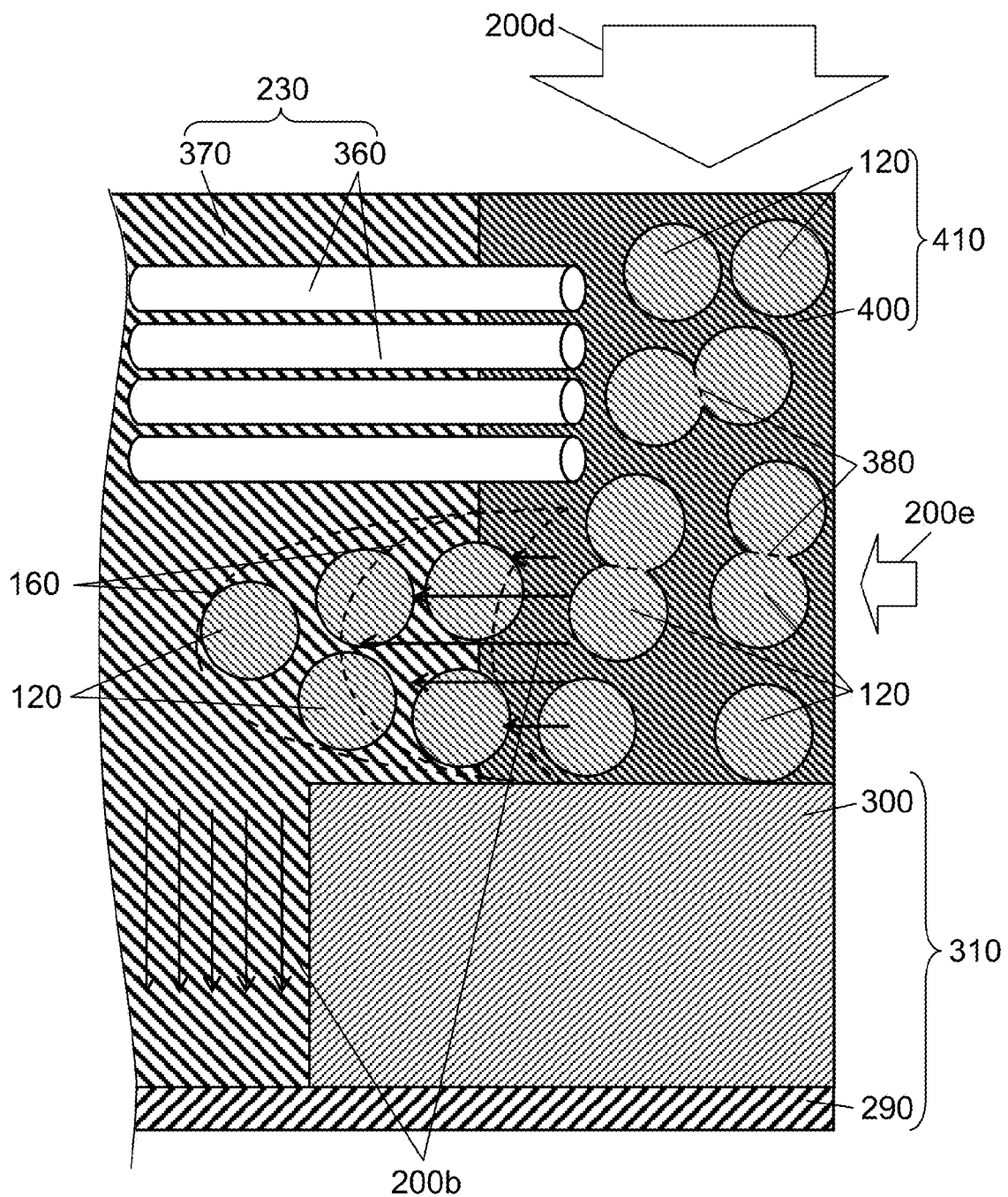
FIG. 19 is a typical sectional view for explaining the state of the via paste according to the first comparative example.

FIGS. 17 to 19 are typical sectional views for explaining a state of a via paste according to a first comparative example. Via paste 410 according to the first comparative example is cured interlockingly with the curing reaction of prepreg 230. In other words, a thermal curing start temperature of thermosetting resin 400 contained in via paste 410 is almost coincident with a softening temperature of prepreg 230.

In FIG. 17, clearance 320 is present between via paste 410 and core substrate portion 310 and they have not come in contact with each other. Then, they are pressurized, heated and adhered as shown in arrow 200d so that a state in FIG. 18 is brought.

FIG. 18 is a sectional view showing a state in which via paste 410 is pressurized, heated and adhered onto core substrate portion 310 as shown in arrow 200d. Arrow 200e indicates a force generated in a part of via paste 410 (particularly, a portion having protruded portion 270 formed thereon or a portion in which the flow of conductive particle 120 is not disturbed by core 360). A part of via paste 410 flows as shown in additional line 160 through arrow 200e. Then, there is obtained deformed via 16 shown in FIG. 24C described above.

FIG. 19 is a typical sectional view for explaining a step subsequent to FIG. 18. In FIG. 19, as illustrated in arrow 200e, a part of via paste 410 flows as shown in additional line 160. Thus, there is obtained deformed via 16 shown in FIG. 24C described above.

Figure 20A:
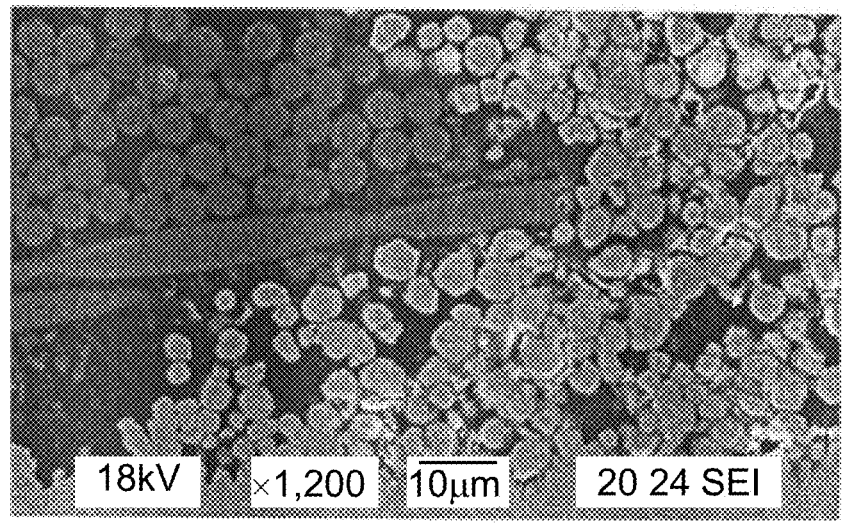
FIG. 20A is a view showing an SEM photograph of a via according to the first comparative example.
Figure 20B:
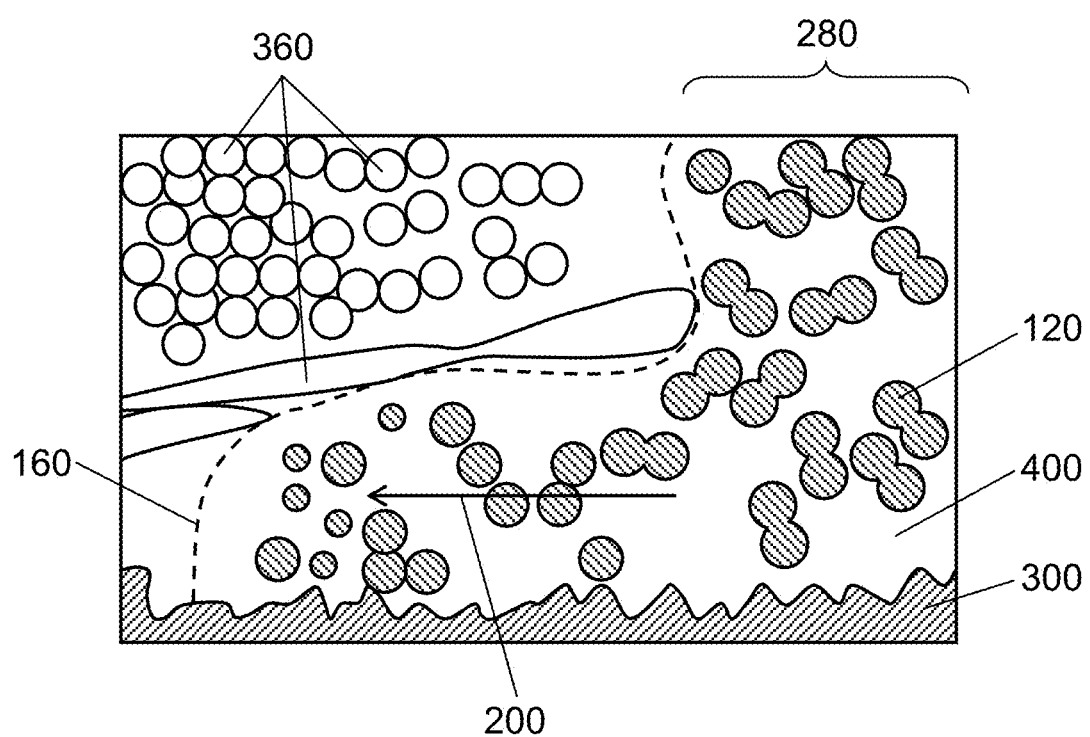
FIG. 20B is a typical top view showing the via according to the first comparative example.

FIGS. 20A and 20B are a sectional view showing an SEM photograph of a deformed via according to the first comparative example and a typical view showing the same.

As shown in FIGS. 20A and 20B, in the case in which via paste 410 is used, a part of the via paste is greatly deformed as shown in additional line 160.

SECOND COMPARATIVE EXAMPLE

Figure 21:
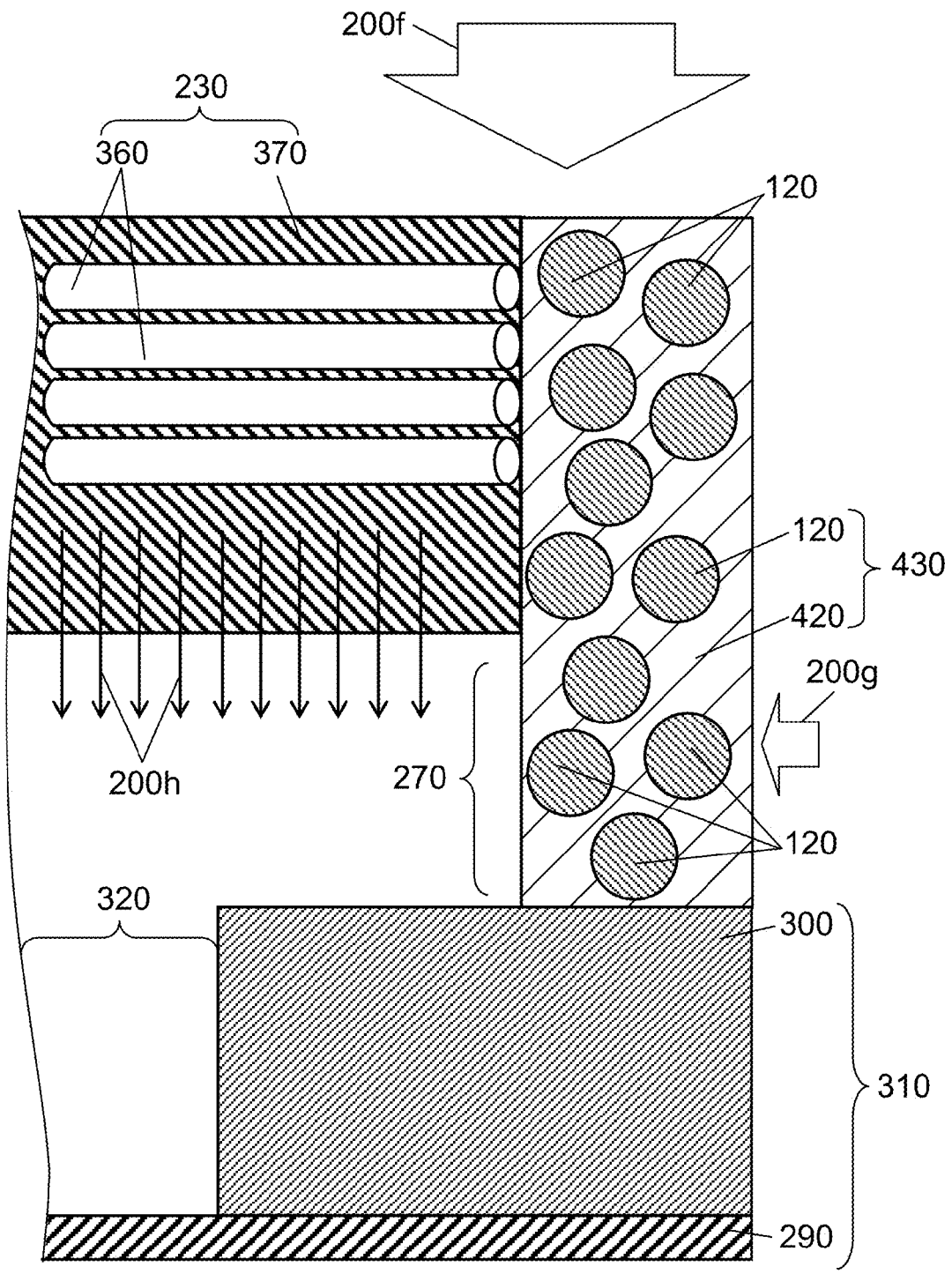
FIG. 21 is a typical sectional view for explaining a state of a via paste according to a second comparative example.
Figure 22A:
FIG. 22A is a typical sectional view showing a conventional method of manufacturing a circuit board.
Figure 22B:
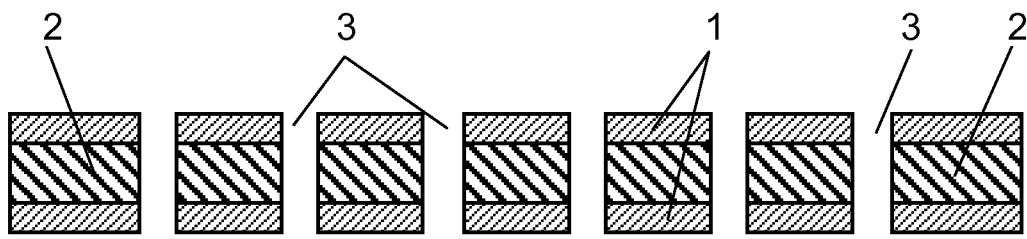
FIG. 22B is a typical sectional view showing the conventional method of manufacturing a circuit board.
Figure 22C:
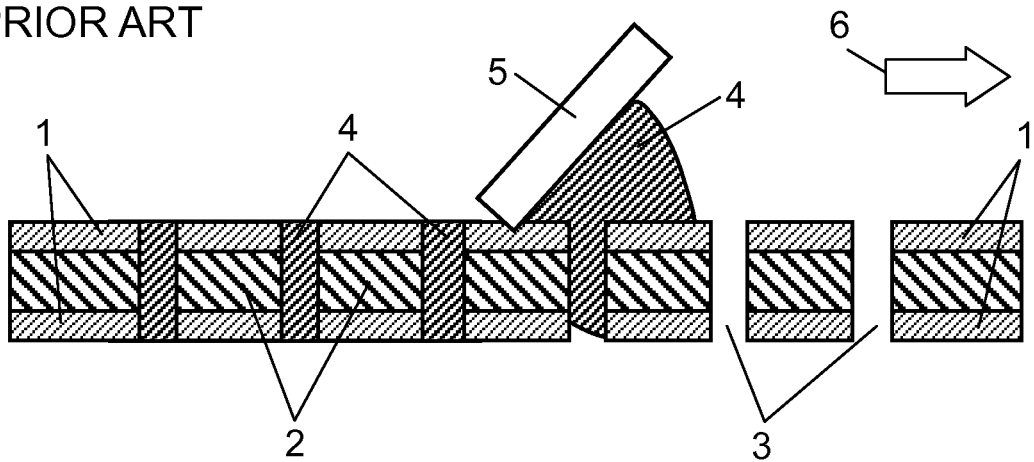
FIG. 22C is a typical sectional view showing the conventional method of manufacturing a circuit board.
Figure 23A:
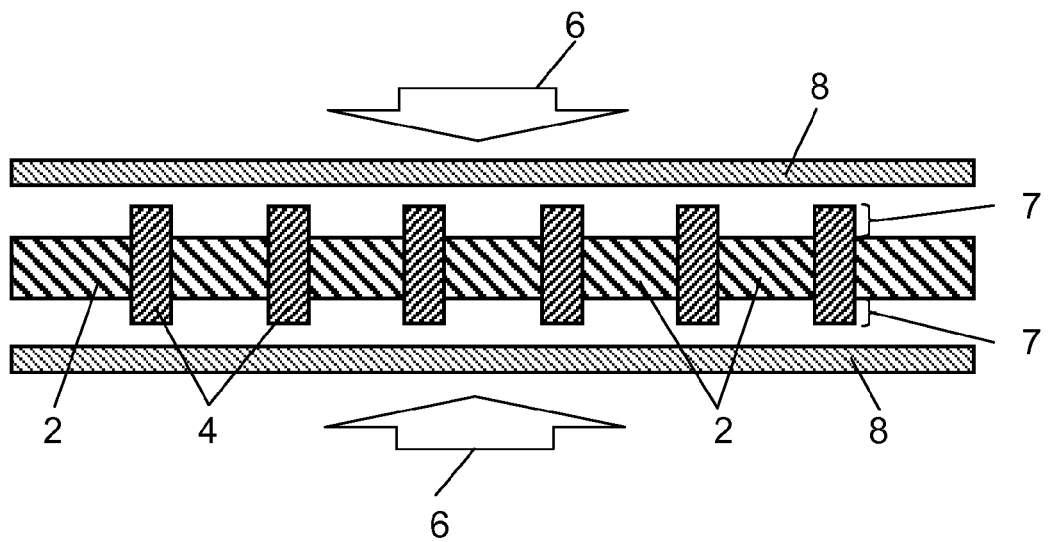
FIG. 23A is a typical sectional view showing the conventional method of manufacturing a circuit board.
Figure 23B:
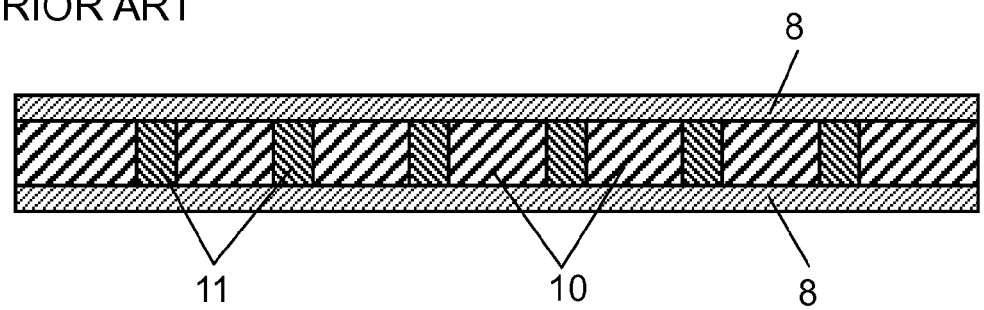
FIG. 23B is a typical sectional view showing the conventional method of manufacturing a circuit board.
Figure 23C:
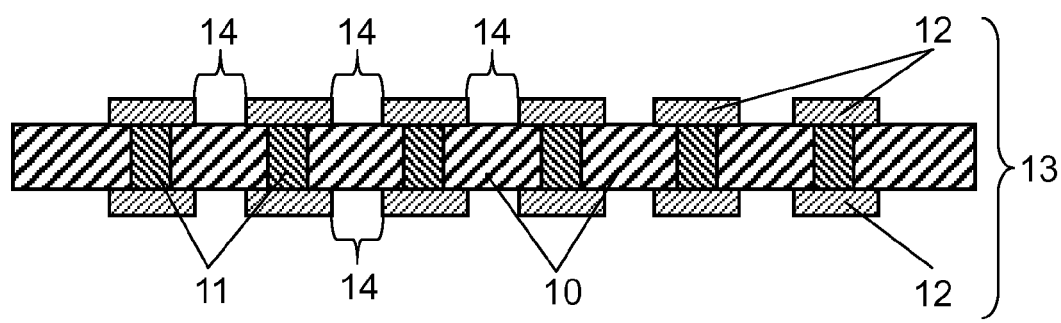
FIG. 23C is a typical sectional view showing the conventional method of manufacturing a circuit board.

FIG. 21 is a typical sectional view for explaining a state of a via paste according to a second comparative example. In the second comparative example, there is used via paste 430 to be cured at a lower temperature than a temperature at which prepreg 230 is heated and softened.

In other words, a curing start temperature of thermosetting resin 420 contained in via paste 430 is lower than the softening temperature of prepreg 230.

In FIG. 21, arrow 200d indicates a pressurizing direction. Arrow 200h indicates a state in which heated and softened prepreg 230 (and furthermore, softened prepreg resin 370) flows into clearance 320 between core substrate portions 310 and clearance 320 is filled up. Arrow 200g indicates a force for deforming via paste 430 by heated and softened prepreg resin 370.

Figure 24A:
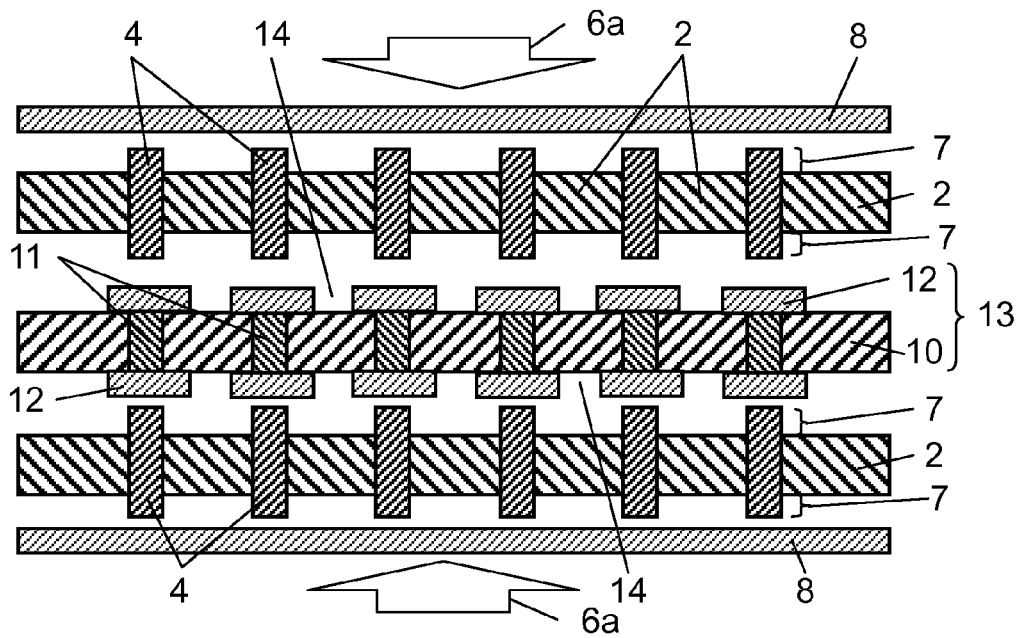
FIG. 24A is a typical sectional view showing the conventional method of manufacturing a circuit board.
Figure 24B:
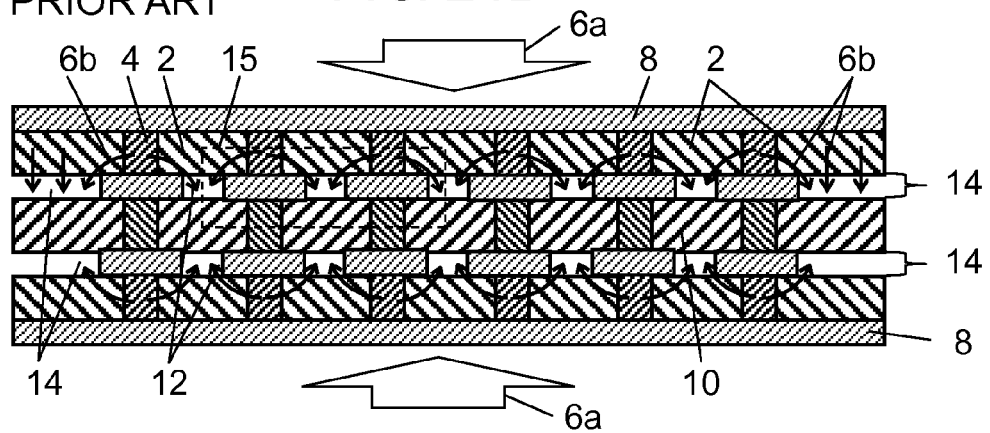
FIG. 24B is a typical sectional view showing the conventional method of manufacturing a circuit board.
Figure 24C:
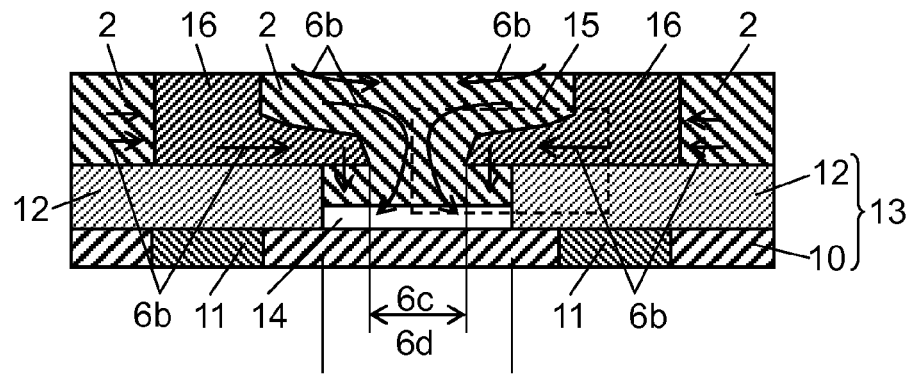
FIG. 24C is a typical sectional view showing the conventional method of manufacturing a circuit board.

In FIG. 21, a reaction starting temperature of via paste 430 is lower than the softening temperature of prepreg 230 (and furthermore, a flow starting temperature of prepreg 230). Therefore, prepreg 230 is cured before flowing as shown in arrow 200h. As a result, via paste 430 is deformed so that deformed via 16 shown in FIG. 24C is not obtained. As shown in FIG. 21, however, thermosetting resin 420 which is thermally cured is present between conductive particles 120 so that there is a possibility that thermosetting resin 420 might disturb an electrical contact between conductive particles 120. In the second comparative example, therefore, there is a possibility that a via resistance might be increased and a variation in the via resistance might be increased.

Next, [Table 1] shows a result obtained by a comparison between insulating reliabilities among the present embodiment, the first comparative example and the second comparative example.

TABLE 1

| Item | Pitch (mm) | First comparative example (150 μm/100 μm) | Second comparative example (150 μm/100 μm) | Present embodiment (150 μm/ 100 μm) |
|---|---|---|---|---|
| Via/Via | 0.4 | ○/○ | ○/○ | ○/○ |
| Via/Via | 0.3 | X/Δ | ○/○ | ○/○ |
| Via/Line | 0.4 | ○/○ | ○/○ | ○/○ |
| Via/Line | 0.3 | X/Δ-○ | ○/○ | ○/○ |

An evaluation for the insulating reliability shown in [Table 1] is carried out between two adjacent vias (an item described as Via/Via) and between the adjacent vias and wirings (an item described as Via/Line). Moreover, mutual insulation distances are set to be 0.4 mm and 0.3 mm to carry out the evaluation. A via diameter is set to be 150 μm and 100 μm. The evaluation is carried out at plural times by using a plurality of test patterns provided on a test substrate having an outside dimension of 600 mm. A test substrate having an excellent insulating reliability result on an internal standard is set to be a good product ○ (pass). Although most of the test substrates are the good products, a test substrate having a problem left partially is set to be Δ (problem), and a test substrate which does not satisfy the insulating reliability on the internal standard is set to be X (fail).

From [Table 1], it is found that both the present embodiment and the second comparative example satisfy the insulating reliability. An internal structure of a trial product having an insulating reliability of X in the first comparative example is analyzed. As shown in FIG. 20, consequently, there is observed a portion in which a part of the via paste is deformed greatly.

On the other hand, while the internal structures of the trial products according to the present embodiment and the second comparative example are observed, the deformation of via paste 110 is rarely generated as shown in FIGS. 16A and 16B.

Next, [Table 2] shows a result obtained by measuring a via resistance.

TABLE 2

| Via diameter | First comparative example (resistance value/ CV value) | Second comparative example (resistance value/ CV value) | Present embodiment (resistance value/ CV value) |
| --- | --- | --- | --- |
| 130 μm | ○/○ | ○/○ | ○/○ |
| 100 μm | ○/○ | ○/○ | ○/○ |
| 80 μm | ○/○ | Δ/Δ | ○/○ |
| 60 μm | ○-Δ/○-Δ | X/X | ○/○ |

In [Table 2], a resistance value of the via hole (N=100) is measured by a four-terminal method, and a test substrate having an average value of less than 2 mΩ is set to be ○ (pass), a test substrate having an average value of 2 mΩ to 3 mΩ is set to be Δ (slightly high), and a test substrate having an average value of more than 3 mΩ is set to be X (fail). Moreover, a variation in the resistance value is evaluated by a CV value. A test substrate having a CV value of less than 20% is set to be ○ (pass), a test substrate having a CV value which is equal to or more than 20% and is less than 50% is set to be Δ (large variation), and a test substrate having a CV value which is equal to or more than 50% is set to be X (problem). The CV value represents a value which is obtained through a division of a standard deviation by an average value and is indicated in %.

From [Table 2], it is found that both the present embodiment and the first comparative example have low via resistances and small variations (CV values) in the via resistances. In the present embodiment and the first comparative example, the reason is supposed as follows. More specifically, a large number of conduction passages (or conduction paths) are formed in via 280 through face contact portion 380 formed by the mutual deformation of conductive particles 120 as shown in FIGS. 15 and 18. On the other hand, in the second comparative example, the reason why the via resistance is high, and furthermore, the variation in the via resistance is also great is supposed as follows. More specifically, thermosetting resin 420 cured between conductive particles 120 influences the electrical connection of conductive particles 120 as shown in FIG. 21.

Next, each member to be used in via paste 110 will be described in more detail.

As first latent curing agent 140 and second latent curing agent 150, it is useful to utilize a latent curing agent for a liquid epoxy resin (which is also referred to as a curing accelerator in some cases). As the latent curing agent, it is possible to use a high boiling active hydrogen compound, a third amine and imidazole salt, a Lewis acid and Bronsted acid salt or the like. For example, it is useful to select any of AJICURE (registered trademark) manufactured by Ajinomoto Fine-Techno Co., Inc. (having types such as an amine adduct system, a hydrazide system, a composite system and a DICY system). For example, a melting point (a softening point) of AJICURE PN-23 is 105° C. and a melting point (a softening point) of MY-24 is 120° C. Moreover, a melting point of AJICURE VDH is 120° C. and a melting point of UDH is 160° C.

Moreover, various latent curing agents based on imidazoles (epoxy-imidazole adduct and the like) are sold by Shikoku Chemicals Corporation.

Furthermore, it is also possible to use FUJICURE (registered trademark) FXR-1020, FXR-1030, FXR-1081, FXR-1121 and the like which are manufactured by T & K TOKA Corporation. In addition, it is also possible to use an amine adduct compound system such as Novacure (registered trademark) manufactured by ASAHI KASEI E-materials Corp. Moreover, it is also possible to use an aromatic amine type having an active hydrogen quantity of 210 to 1050 (g/eq), a BPA type phenol resin and the like which are sold by Nippon Steel Chemical Co., Ltd.

The reaction of the latent curing agent does not always need to be developed at a melting point. At a lower temperature than the melting point (for example, a lower temperature than the melting point by approximately 5° C. to 20° C.), it is also possible to start a curing reaction to uncured resin mixture 130. It is preferable to positively cause the melting points of first latent curing agent 140 and second latent curing agent 150 to be different from each other or to cause the melting points of the two latent curing agents to be different from each other as means for developing two different heat generation peak temperatures (Tp1, Tp2) or two different reaction starting temperatures (Ts1, Ts2).

As a method of measuring the softening temperature, it is possible to select a Vicat softening temperature (JIS K7206, ISO 306, ASTM D1525). As a testing method, it is preferable to properly select an A-50 method, an A-120 method, a B-50 method, a B-120 method and the like. In addition, it is also possible to select a ring and ball softening point method of JIS K2207. By using a probe with a needle which is attached to TMA, moreover, it is also possible to measure a process in which the probe is gradually embedded in a sample when the sample becomes softer with the probe provided in contact with a sample, thereby specifying a softening point through calculation based on a graph of the TMA (for example, JIS K 7196).

As uncured resin mixture 130, moreover, it is also possible to use a liquid bisphenol A type epoxy resin which is put on the market. For the liquid bisphenol A type epoxy resin, it is useful to select any proper part number from Epikote (registered trademark) manufactured by Mitsubishi Chemical Corporation (or manufactured by Japan Epoxy Resins Co. Ltd.,).

It is useful that conductive particle 120 is chosen from at least one metal powder selected from a group of metal powder such as copper powder and silver coating copper powder.

Moreover, it is useful that the softening temperature (or the softening start temperature) of prepreg 230 to be utilized in circuit board 330 according to the present embodiment is set onto a higher temperature side than Ts1 (and furthermore, a higher temperature side than Tp1).

Furthermore, it is also useful that uncured epoxy resins having different functional groups from each other are set to be uncured epoxy resins to be mixed with each other and used in uncured resin mixture 130. The reason is that a reactivity is higher if the number of the functional groups is larger (for example, three to four per molecule) and is lower if the number of the functional groups is smaller (for example, one per molecule). For uncured resin mixture 130, thus, resins having different epoxy equivalent weights from each other (desirably, by 10 or more, and furthermore, by 20 or 50 or more) may be mixed mutually or resins having different numbers of functional groups from each other (desirably, one or more per molecule, and furthermore, two or more per molecule) may be mixed mutually. It is also useful to mix a resin having a different epoxy equivalent weight and a resin having a different number of functional groups are mixed with each other. In the case in which two types of uncured epoxy resins are mixed with each other, it is desirable that they should be set into a range of a rate of 20:80 to 80:20 in a weight ratio (desirably, a range of 40:60 to 60:40). Consequently, it is possible to enhance a uniformity in the case in which two types of (and furthermore, a plurality of) uncured epoxy resins are mixed each other.

By mixing a resin having an epoxy equivalent weight of approximately 400 (the number of functional groups of two) and a resin having an epoxy equivalent weight of approximately 90 (the number of functional groups of three) in the rate described above, a desirable result is obtained. In the case in which a plurality of epoxy resins are mixed, it is useful that one of them is set to have a larger epoxy equivalent weight than an equivalent weight of a bisphenol type epoxy resin of 190 or a larger number of the functional groups than two and the other is set to have a smaller epoxy equivalent weight than the equivalent weight of the bisphenol type epoxy resin of 190 or a smaller number of the functional groups than one. Also in this case, it is desirable that a difference between the epoxy equivalent weights should be set to be 10 or more (and furthermore, 20 or more, or 50 or more).

INDUSTRIAL APPLICABILITY

According to the present embodiment, it is possible to further decrease a cost, reduce a size, enhance a function and improve a reliability in a multilayer circuit board to be used in a portable telephone or the like.

REFERENCE MARKS IN THE DRAWINGS

| | |
|---|---|
| 110 | via paste |
| 120 | conductive particle |
| 130 | uncured resin mixture |
| 140 | first latent curing agent |
| 150 | second latent curing agent |
| 15, 160, 160a, 160b, 160c, 160d, 180a, 180b, 180c, 180d | additional line |
| 170, 170a, 170b, 170c, 170d, 170e, 170f | graph |
| 180 | first cured product |
| 190 | cured thermosetting resin |
| 200, 200a, 200b, 200c, 255, 200d, 200e, 200f, 200g, 200h | arrow |
| 210 | flat region |
| 220 | protective film |
| 230 | prepreg |
| 240 | hole |
| 250 | squeegee |

-continued

REFERENCE MARKS IN THE DRAWINGS

| | |
|---|---|
| 260 | copper foil |
| 270 | protruded portion |
| 280 | via |
| 290 | insulating layer |
| 300 | wiring |
| 310 | core substrate portion |
| 320 | clearance |
| 330 | circuit board |
| 340 | first wiring |
| 350 | second wiring |
| 360 | core |
| 370 | prepreg resin |
| 380 | face contact portion |
| 390 | cured prepreg resin |
| 400 | thermosetting resin |
| 410 | via paste |
| 420 | thermosetting resin |
| 430 | via paste |

The invention claimed is:

1. A circuit board comprising:
   a core substrate portion having a first wiring provided on a surface thereof;
   a second wiring laminated on the core substrate portion through an insulating layer; and
   a via filled in a hole formed on the insulating layer, such that the via has a protruded portion in the hole, for electrically connecting the first wiring to the second wiring,
   wherein the insulating layer is formed of a cured product of a prepreg,
   the via is formed of a cured product of a via paste,
   the via paste has a first latent curing agent and a second latent curing agent, an uncured resin mixture to be cured by the first latent curing agent and the second latent curing agent, and a conductive particle,
   both a softening temperature of the first latent curing agent and that of the second latent curing agent are equal to or higher than 40° C. and are equal to or lower than 200° C., and a difference between the softening temperature of the first latent curing agent and that of the second latent curing agent is equal to or higher than 10° C. and is equal to or lower than 140° C.,
   the prepreg is softened between the softening temperature of the first latent curing agent and that of the second latent curing agent, and
   the via paste is cured by increase in a viscosity and is thus changed into the cured product of the via paste in the hole of the prepreg.

2. The circuit board according to claim 1, wherein a differential scanning calorimetry shows that the via paste has a first heat generation peak temperature and a second heat generation peak temperature which is higher than the first heat generation peak temperature, both the first heat generation peak temperature and the second heat generation peak temperature are equal to or higher than 40° C. and are equal to or lower than 200° C., and a difference between the first heat generation peak temperature and the second heat generation peak temperature is equal to or higher than 10° C. and is equal to or lower than 140° C.

3. The circuit board according to claim 1, wherein a differential scanning calorimetry shows that the via paste has a first reaction starting temperature and a second reaction starting temperature which is higher than the first reaction starting temperature, both the first reaction starting temperature and the second reaction starting temperature are equal to or higher than 40° C. and are equal to or lower than 200° C., and a difference between the first reaction starting temperature and the second reaction starting temperature is equal to or higher than 10° C. and is equal to or lower than 140° C.

4. The circuit board according to claim 1, wherein the via paste includes a flat temperature region between 50° C. and 180° C. inclusive in a range of 5° C. or more, and a viscosity changes a little in this flat temperature region.

5. A method of manufacturing a circuit board comprising:
a core substrate portion having a first wiring provided on a surface thereof;
a second wiring laminated on the core substrate portion through an insulating layer formed of a cured product of a prepreg; and
a via formed of a cured product of a via paste, filled in a hole formed on the prepreg to be the insulating layer, such that the via has a protruded portion in the hole, for electrically connecting the first wiring to the second wiring,
wherein the via paste has a first latent curing agent and a second latent curing agent, an uncured resin mixture to be cured by the first latent curing agent and the second latent curing agent, and a conductive particle,
both a softening temperature of the first latent curing agent and that of the second latent curing agent are equal to or higher than 40° C. and are equal to or lower than 200° C., and a difference between the softening temperature of the first latent curing agent and that of the second latent curing agent is equal to or higher than 10° C. and is equal to or lower than 140° C., and
the prepreg is softened between the softening temperature of the first latent curing agent and that of the second latent curing agent, and the via paste is cured by increase in a viscosity and is thus changed into the cured product of the via paste in the hole of the prepreg,
the method comprising:
a preparing step of preparing the prepreg;
a first step of covering a surface of the prepreg with a protective film;
a second step of forming the hole on the prepreg through the protective film;
a third step of filling the hole with the via paste including the first latent curing agent and the second latent curing agent which have different curing start temperatures from each other, the uncured resin mixture to be cured by the first latent curing agent and the second latent curing agent, and the conductive particle;
a fourth step of peeling the protective film for exposing the protruded portion, which is formed by protruding a part of the via paste, from the through hole after the third step;
a fifth step of disposing a copper foil all over the prepreg in order to cover the protruded portion;
a sixth step of press bonding the copper foil to a surface of the prepreg to compress the via paste through the protruded portion for providing a face contact portion formed by face contacts between the conductive particles; then
a heating step including a first heating step of heating the via paste up to 40° C. or more and 200° C. or less for starting a thermal curing reaction of the uncured resin mixture and the first latent curing agent;
a second heating step of carrying out heating the via paste up to a higher temperature than that in the first heating step and 200° C. or less for softening a prepreg resin in the prepreg; and
a third heating step of carrying out heating the via paste up to a higher temperature than that in the second heating step and 200° C. or less for starting a heat curing reaction of the residual uncured resin mixture and the second latent curing agent,
wherein the core substrate portion is formed by the first step through the fourth step;
the second wiring is formed through the fifth step; and
the via is formed through the sixth step and the subsequent heating step.

6. The method of manufacturing a circuit board according to claim 5, wherein a differential scanning calorimetry shows that the via paste has a first heat generation peak temperature and a second heat generation peak temperature which is higher than the first heat generation peak temperature, both the first heat generation peak temperature and the second heat generation peak temperature are equal to or higher than 40° C. and are equal to or lower than 200° C., and a difference between the first heat generation peak temperature and the second heat generation peak temperature is equal to or higher than 10° C. and is equal to or lower than 140° C.

7. The method of manufacturing a circuit board according to claim 5, wherein a differential scanning calorimetry shows that the via paste has a first reaction starting temperature and a second reaction starting temperature which is higher than the first reaction starting temperature, both the first reaction starting temperature and the second reaction starting temperature are equal to or higher than 40° C. and are equal to or lower than 200° C., and a difference between the first reaction starting temperature and the second reaction starting temperature is equal to or higher than 10° C. and is equal to or lower than 140° C.

8. The method of manufacturing a circuit board according to claim 7, wherein the thermal curing reaction at the first heating step is started at the first reaction starting temperature.

9. The method of manufacturing a circuit board according to claim 7, wherein the thermal curing reaction at the third heating step is started at the second reaction starting temperature.

10. The method of manufacturing a circuit board according to claim 5, wherein the via paste includes a flat temperature region between 50° C. and 180° C. inclusive in a range of 5° C. or more.

* * * * *